United States Patent
Tanaka et al.

(10) Patent No.: US 8,178,917 B2
(45) Date of Patent: *May 15, 2012

(54) NON-VOLATILE SEMICONDUCTOR STORAGE DEVICE HAVING MEMORY CELLS DISPOSED THREE-DIMENSIONALLY, AND METHOD OF MANUFACTURING THE SAME

(75) Inventors: Hiroyasu Tanaka, Tokyo (JP); Ryota Katsumata, Yokohama (JP); Masaru Kito, Yokohama (JP); Yoshiaki Fukuzumi, Yokohama (JP); Masaru Kidoh, Komae (JP); Yosuke Komori, Yokohama (JP); Hideaki Aochi, Kawasaki (JP); Megumi Ishiduki, Yokohama (JP); Yasuyuki Matsuoka, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 476 days.

This patent is subject to a terminal disclaimer.

(21) Appl. No.: 12/408,249

(22) Filed: Mar. 20, 2009

(65) Prior Publication Data

US 2009/0267135 A1 Oct. 29, 2009

(30) Foreign Application Priority Data

Apr. 28, 2008 (JP) ................................. 2008-117508

(51) Int. Cl.
*H01L 29/792* (2006.01)
(52) U.S. Cl. .......................... 257/324; 438/257; 438/264
(58) Field of Classification Search .................. 257/324, 257/E21.423; 438/257, 264

See application file for complete search history.

(56) References Cited

U.S. PATENT DOCUMENTS

| 6,870,215 | B2* | 3/2005 | Endoh et al. | 257/316 |
|---|---|---|---|---|
| 7,224,019 | B2* | 5/2007 | Hieda et al. | 257/315 |
| 7,732,891 | B2* | 6/2010 | Tanaka et al. | 257/522 |
| 7,847,334 | B2* | 12/2010 | Katsumata et al. | 257/315 |
| 7,910,432 | B2* | 3/2011 | Tanaka et al. | 438/257 |
| 2007/0252201 | A1* | 11/2007 | Kito et al. | 257/331 |
| 2008/0175032 | A1* | 7/2008 | Tanaka et al. | 365/51 |
| 2008/0203378 | A1* | 8/2008 | Tanaka et al. | 257/5 |

* cited by examiner

*Primary Examiner* — Howard Weiss
*Assistant Examiner* — Steven Rao
(74) *Attorney, Agent, or Firm* — Oblon, Spivak, McClelland, Maier & Neustadt, L.L.P.

(57) ABSTRACT

A non-volatile semiconductor storage device includes a first layer and a second layer. The first layer includes: a plurality of first conductive layers extending in parallel to a substrate and laminated in a direction perpendicular to the substrate; a first insulation layer formed on an upper layer of the plurality of first conductive layers; a first semiconductor layer formed to penetrate the plurality of first conductive layers; and a charge accumulation layer formed between the first conductive layers and the first semiconductor layer. Respective ends of the first conductive layers are formed in a stepwise manner in relation to each other in a first direction. The second layer includes: a plurality of second conductive layers extending in parallel to the substrate and laminated in a direction perpendicular to the substrate, the second conductive layers being formed in the same layer as the plurality of first conductive layers; and a second insulation layer formed on an upper layer of the plurality of second conductive layers. Respective ends of the second conductive layers are formed to align along a straight line extending in a direction substantially perpendicular to the substrate at a predetermined area.

20 Claims, 32 Drawing Sheets

NON-VOLATILE SEMICONDUCTOR STORAGE DEVICE HAVING MEMORY CELLS DISPOSED THREE-DIMENSIONALLY, AND METHOD OF MANUFACTURING THE SAME

CROSS-REFERENCE TO RELATED APPLICATIONS

This application is based upon and claims the benefit of priority from the prior Japanese Patent Application No. 2008-117508, filed on Apr. 28, 2008, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although some measures are taken to reduce the dimension for each device (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled, for example. Thus, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1: Japanese Patent Laid-Open No. 2007-266143; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with cylinder-type structure (see, Patent Documents 1-3). Those semiconductor storage devices using transistors with cylinder-type structure are provided with multiple laminated conductive layers, corresponding to gate electrodes, and pillar-like columnar semiconductors. Each of the columnar semiconductors serves as a channel (body) part of each of the transistors. Memory gate insulation layers that can accumulate charges are provided around the columnar semiconductors. Such configuration including laminated conductive layers, columnar semiconductors, and memory gate insulation layers is referred to as a "memory string".

During the process of forming such memory strings, CMP (Chemical Mechanical Polishing) is repeated multiple times. In the CMP process, memory layers and CMP dummy layers are provided on the substrate. The memory layers represent those regions that are desired to be flattened by the CMP process. The CMP dummy layers function as stoppers that are used for making the polished surfaces of the memory layers parallel to a desired surface in flattening the memory layers by CMP.

There is a need for reduction in the area occupied by both the memory layers and the CMP dummy layers. That is, there is a need for reducing the area of the entire semiconductor storage devices.

SUMMARY OF THE INVENTION

One aspect of the present invention provides a non-volatile semiconductor storage device comprising: a first layer functioning as a plurality of electrically rewritable memory cells connected in series; and a second layer provided on the periphery of the first layer, the first layer comprising: a plurality of first conductive layers extending parallel to a substrate and laminated in a direction perpendicular to the substrate, the first conductive layers functioning as control gates of the memory cells, a first insulation layer formed on an upper layer of the plurality of first conductive layers; a first semiconductor layer formed to penetrate the plurality of first conductive layers; and a charge accumulation layer formed between the first conductive layers and the first semiconductor layer and configured to be able to accumulate charges, respective ends of the first conductive layers being formed in a stepwise manner in relation to each other in a first direction, the second layer comprising: a plurality of second conductive layers extending in parallel to the substrate and laminated in a direction perpendicular to the substrate, the second conductive layers being formed in the same layer as the plurality of first conductive layers; and a second insulation layer formed on an upper layer of the plurality of second conductive layers, and respective ends of the second conductive layers being formed to align along a straight line extending in a direction substantially perpendicular to the substrate at a predetermined area.

Another aspect of the present invention provides a method of manufacturing a non-volatile semiconductor storage device having a plurality of electrically rewritable memory cells connected in series, the method comprising: forming a plurality of first conductive layers extending parallel to a substrate so that the first conductive layers are laminated on the substrate over multiple layers; processing the plurality of first conductive layers in a stepwise manner in relation to each other at respective ends in a first direction in a first area; forming a first through hole to penetrate the plurality of first conductive layers at a predetermined area in a second area different from the first area; forming a first insulation layer in the first through hole; forming a second through hole to penetrate the first insulation layer; and forming second conductive layers to fill up the second through hole.

DETAILED DESCRIPTION OF THE EMBODIMENTS

Embodiments of a non-volatile semiconductor storage device according to the present invention will be described below with reference to the accompanying drawings.

First Embodiment

Figure 1:
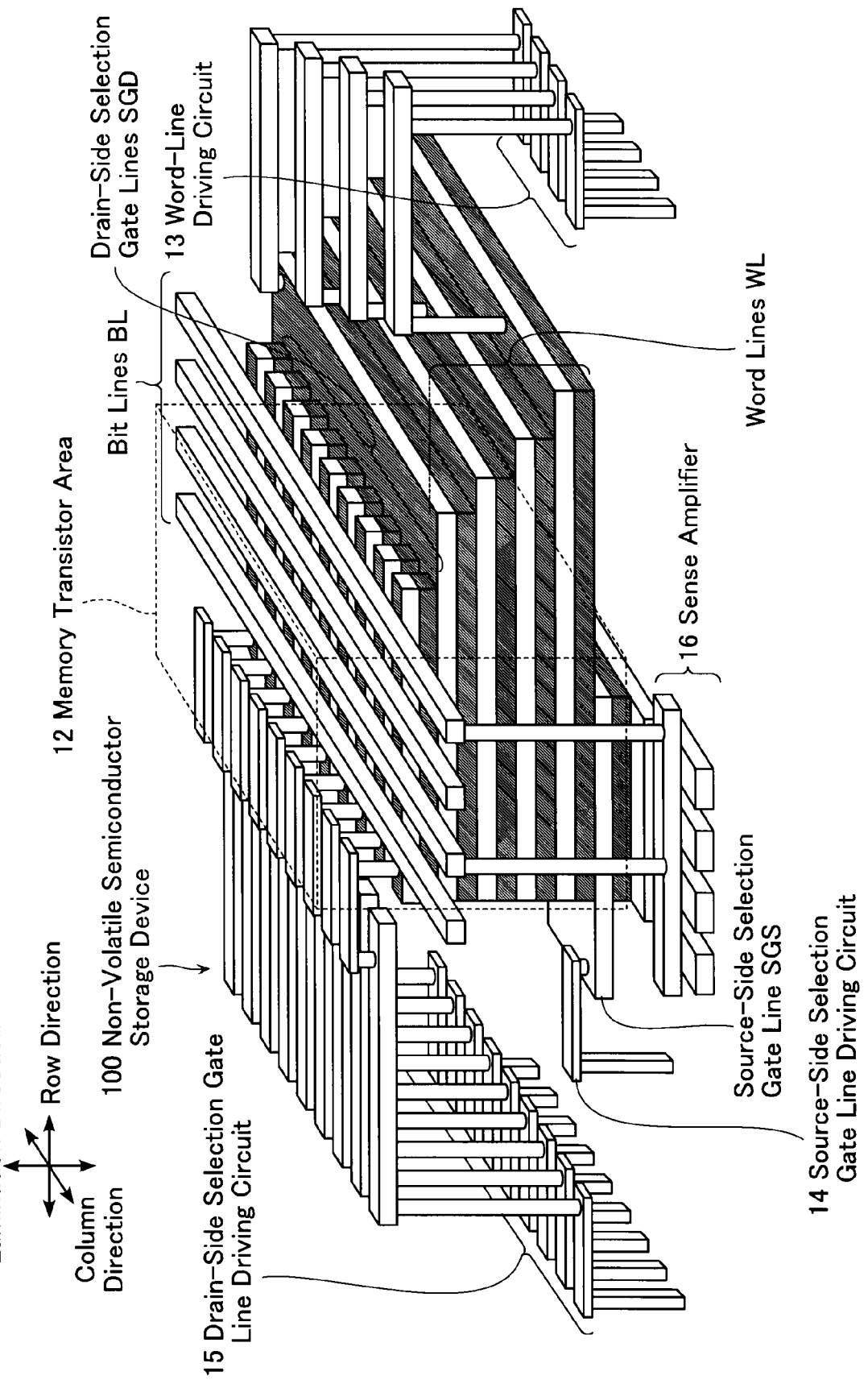
FIG. 1 is a schematic diagram illustrating a configuration of a non-volatile semiconductor storage device 100 according to a first embodiment of the present invention.

Configuration of Non-Volatile Semiconductor Storage Device 100 in First Embodiment FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area (first area) 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines (SGD). The sense amplifier 16 amplifies a potential read from a memory transistor. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors that configure the memory transistor area 12 are formed by lamination of a plurality of semiconductor layers. In addition, as illustrated in FIG. 1, a word line WL of each layer is formed to expand in a two-dimensional manner in the horizontal direction. The word line WL of each layer has a planar plate-like structure of the same layer.

Figure 2:
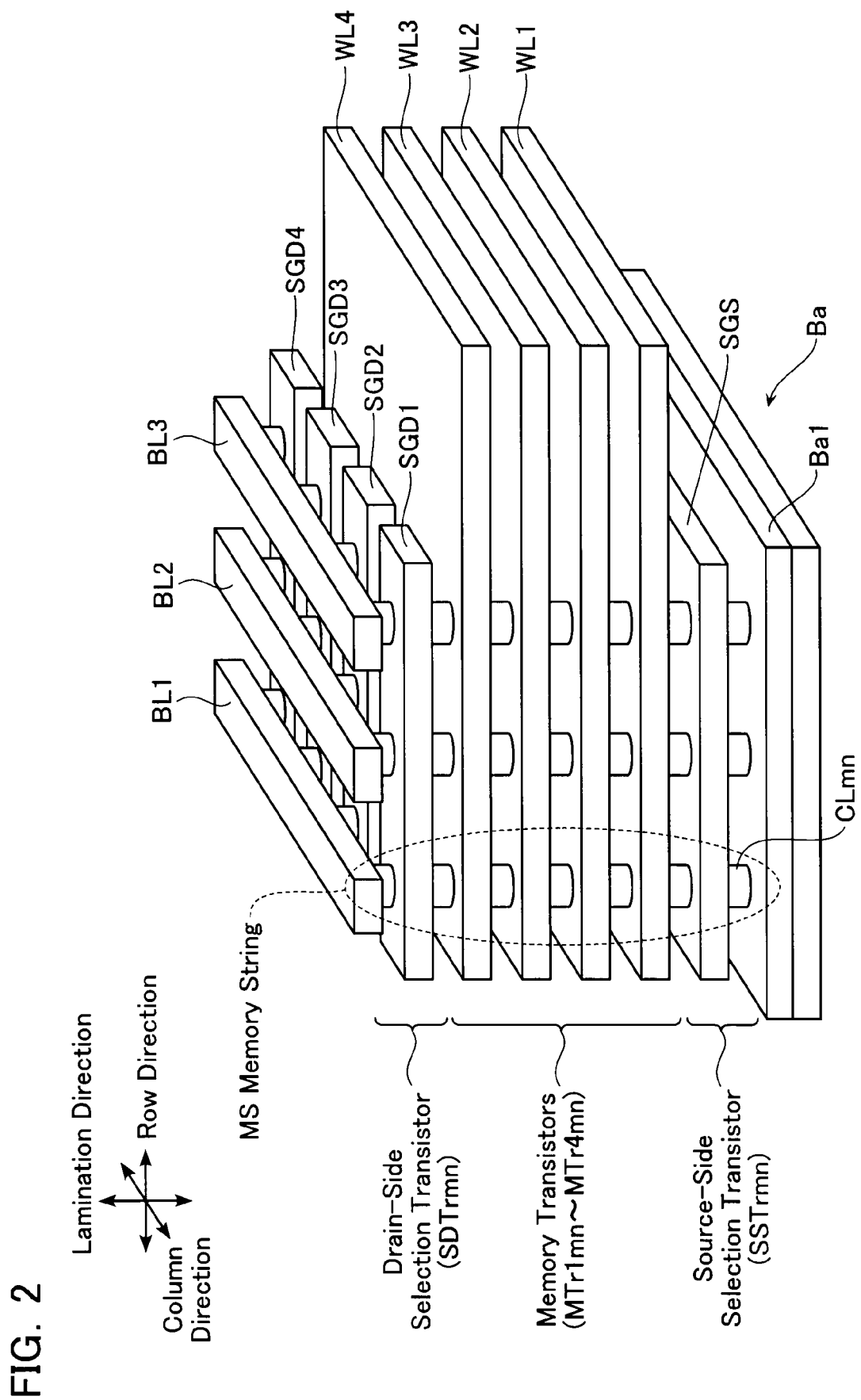
FIG. 2 is a perspective view schematically illustrating a part of the memory transistor area 12 in the non-volatile semiconductor storage device 100 according to the first embodiment of the present invention.

FIG. 2 is a perspective view schematically illustrating a part of the memory transistor area 12 in the non-volatile semiconductor storage device 100 according to the first embodiment. According to the first embodiment, the memory transistor area 12 has m×n (m, n=natural number) memory strings MS, each of which includes memory transistors MTr1*mn* to MTr4*mn*, a source-side selection transistor SSTrmn, and a drain-side selection transistor SDTrmn. In FIG. 2, given that m=3, n=4.

In each of the memory strings MS, each of word lines WL1 to WL4 connected to the gate of each of the memory transistors MTr1*mn* to MTr4*mn* is formed by the same conductive film and used in common therein. That is, in the memory strings MS, all gates of the memory transistors MTr1*mn* are connected to the word line WL1. In addition, in the memory strings MS, all gates of the memory transistors MTr2*mn* are connected to the word line WL2. In addition, in the memory strings MS, all gates of the memory transistors MTr3*mn* are connected to the word line WL3. In addition, in the memory strings MS, all gates of the memory transistors MTr4*mn* are connected to the word line WL4. As illustrated in FIGS. 1 and 2, in the non-volatile semiconductor storage device 100 according to the first embodiment, each of the word lines WL1 to WL4 is formed to expand in a two-dimensional manner in the horizontal direction parallel to the semiconductor substrate Ba. In addition, the word lines WL1 to WL4 are arranged substantially perpendicular to the respective memory strings MS. In addition, the row-direction ends of the word lines WL1 to WL4 are formed in a stepwise manner in relation to each other. Wherein, the row direction represents a direction orthogonal to the vertical direction and the column direction represents another orthogonal to the vertical direction and the row direction.

Each of the memory strings MS has columnar semiconductors CLmn (in the case of FIG. 2, m=1 to 3, n=1 to 4) provided on an $n^+$ area (Ba2, as described later) formed on a P-well area Ba1 of a semiconductor substrate Ba. Each of the columnar semiconductors CLmn is formed in a direction perpendicular to the semiconductor substrate Ba and arranged in a matrix form on the surfaces of the semiconductor substrate Ba and the word lines WL1 to WL4. That is, each of the memory strings MS is also arranged in a matrix form within a plane perpendicular to the corresponding columnar semiconductor CLmn. Note that the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulating films (not illustrated) to configure respective drain-side selection transistors SDTrmn. The drain-side selection gate lines SGD are insulated and isolated from each other and, unlike the word lines WL1 to WL4, formed to extend in the row direction and formed in lines repeatedly provided in the column direction. In addition, columnar semiconductors CLmn are provided to penetrate the center in the column direction of the drain-side selection gate lines SGD.

Further, as illustrated in FIG. 2, provided on the lower portions of the memory strings MS is a source-side selection gate line SGS, which contact the columnar semiconductors CLmn via insulating films (not illustrated) to configure respective source-side selection transistors SSTrmn. As with the word lines WL1 to WL4, the source-side selection gate line SGS is formed to expand in a two-dimensional manner in the horizontal direction. Note that, in addition to the structure as illustrated in FIG. 2, the source-side selection gate line SGS may be formed to extend in the row direction and formed in strips repeatedly provided in the column direction.

Figure 3:
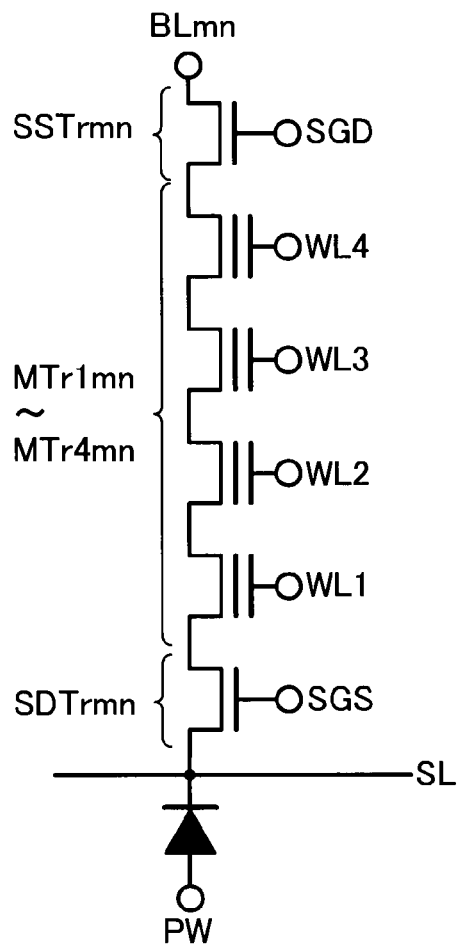
FIG. 3 is a circuit diagram illustrating one memory string MS according to the first embodiment of the present invention.

Referring now to FIGS. 2 and 3, the circuit configuration and operation of the memory strings MS of the first embodiment will be described below. FIG. 3 is a circuit diagram illustrating one memory string MS according to the first embodiment.

As illustrated in FIGS. 2 and 3, in the first embodiment, each of the memory strings MS has four memory transistors MTr1*mn* to MTr4*mn* as well as the source-side selection transistor SSTrmn and the drain-side selection transistor SDTrmn. These four memory transistors MTr1*mn* to MTr4*mn* as well as the source-side selection transistor SSTrmn and the drain-side selection transistor SDTrmn are connected in series to each other (see FIG. 3). According to the first embodiment, in each of the memory strings MS, a columnar semiconductor CLmn is formed on an $n^+$ area that is formed in a $p^-$ type area (P-well area) Ba1 on the semiconductor substrate Ba.

In addition, a source line SL (an $n^+$ area formed in the P-well area Ba1 on the semiconductor substrate Ba) is connected to the source of each source-side selection transistor SSTrmn. Further, a bit line BL is connected to the drain of each drain-side selection transistor SDTrmn.

Each of the memory transistors MTrmn has a columnar semiconductor CLmn, a charge accumulation layer formed to surround the columnar semiconductor CLmn, and a word line WL formed to surround the charge accumulation layer. Each word line WL functions as a control gate electrode of the corresponding memory transistor MTrmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is read, written and erased by controlling charges of the charge accumulation layer in a predetermined memory transistor MTrmn.

Figure 4:
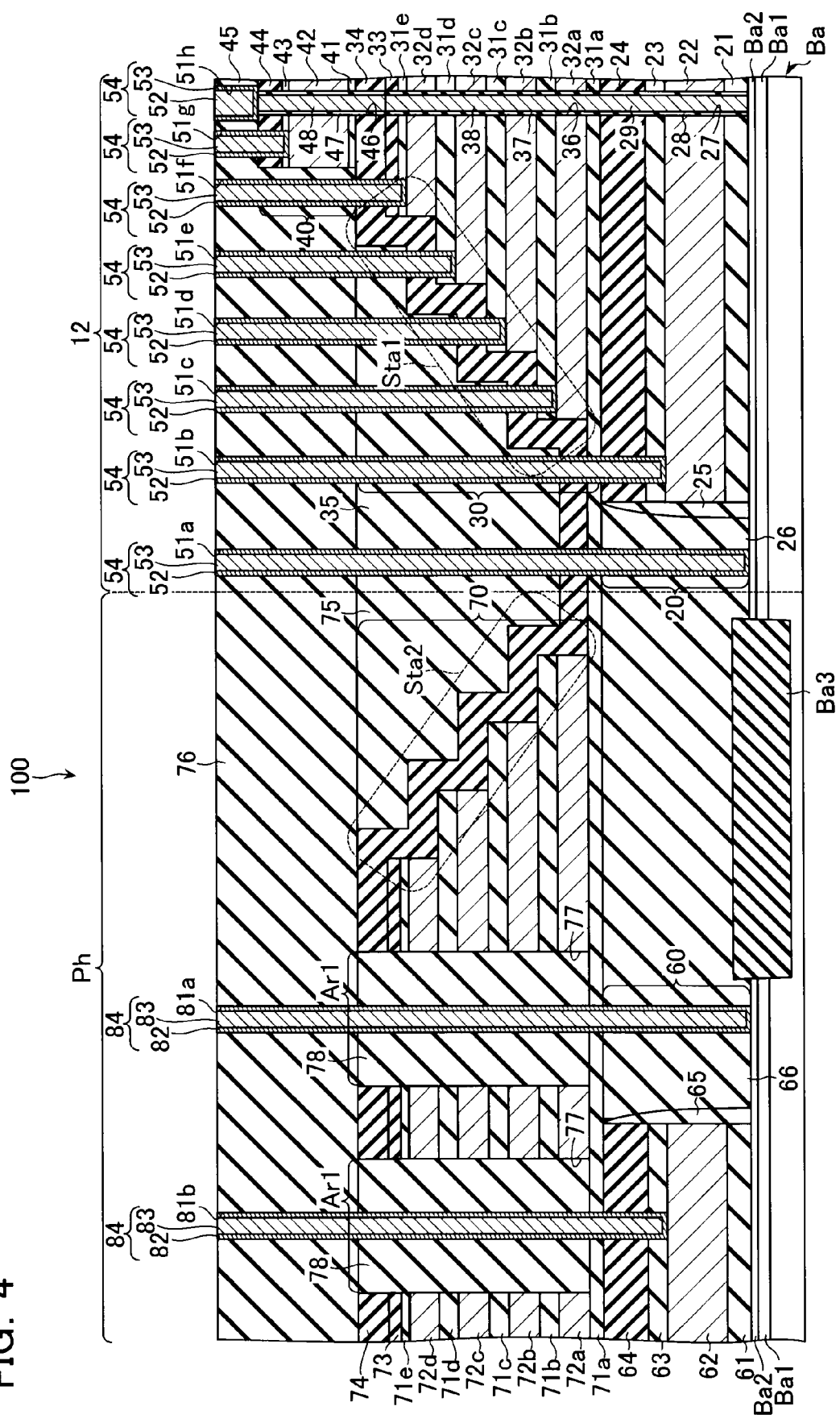
FIG. 4 is a cross-sectional view of the non-volatile semiconductor storage device 100 according to the first embodiment.

Specific Configuration of Non-Volatile Semiconductor Storage Device 100 in First Embodiment Referring now to FIG. 4, a further specific configuration of the non-volatile semiconductor storage device 100 according to the first embodiment will be described below. FIG. 4 is a cross-sectional view along the row direction of the non-volatile semiconductor storage device according to the first embodiment. As illustrated in FIG. 4, the non-volatile semiconductor storage device 100 has the above-mentioned memory transistor area 12 and a peripheral area (second area) Ph which is provided on the periphery of the memory transistor area 12.

The memory transistor area 12 has a source-side selection transistor layer (third layer) 20, a memory transistor layer (first layer) 30, and a drain-side selection transistor layer 40 (fourth layer) that are sequentially provided on the semiconductor substrate Ba. The source-side selection transistor layer 20, the memory transistor layer 30, and the drain-side selection transistor layer 40 together configure a memory string MS.

The source-side selection transistor layer 20 functions as a source-side selection transistor SSTrmn. The memory transistor layer 30 functions as a memory transistor MTrmn. The memory transistor layer 30 functions as a plurality of electrically rewritable memory cells connected in series. The drain-side selection transistor layer 40 functions as a drain-side selection transistor SDTrmn.

The peripheral area Ph has a first CMP dummy layer (fifth layer) 60 and a second CMP dummy layer (second layer) 70. The first CMP dummy layer 60 is used for making the polished surface of the source-side selection transistor layer 20 parallel to a desired surface in flattening the source-side selection transistor layer by CMP. The second CMP dummy layer 70 is used for making the polished surface of the memory transistor layer 30 parallel to a desired surface in flattening the memory transistor layer 30 by CMP.

Firstly, the configuration of the memory transistor area 12 (the source-side selection transistor layer 20, the memory transistor layer 30, and the drain-side selection transistor layer 40) will be described below.

A p⁻ type area (P-well area) Ba1 is formed on the semiconductor substrate Ba in the memory transistor area 12. In addition, an n⁺ area (source line area) Ba2 is formed on the p⁻ type area Ba1.

The source-side selection transistor layer 20 has a source-side first insulation layer 21, a source-side conductive layer 22, a source-side second insulation layer 23, and a source-side isolation/insulation layer 24 that are sequentially laminated on the semiconductor substrate Ba.

The source-side first insulation layer 21, the source-side conductive layer 22, the source-side second insulation layer 23, and the source-side isolation/insulation layer 24 are each formed to expand in a two-dimensional manner at the memory transistor area 12 in the horizontal direction parallel to the semiconductor substrate Ba. The source-side first insulation layer 21, the source-side conductive layer 22, the source-side second insulation layer 23, and the source-side isolation/insulation layer 24 are arranged separately for each predetermined area (an erase unit) in the memory transistor area 12. A sidewall insulation layer 25 is formed on their row- and column-direction ends. An interlayer insulation layer 26 is also provided ranging from the top of the semiconductor substrate Ba to the top of the source-side isolation/insulation layer 24.

The source-side first insulation layer 21 and the source-side second insulation layer 23 are composed of silicon oxide (SiO₂). The source-side conductive layer 22 is composed of p⁺ type polysilicon (p-Si). The source-side isolation/insulation layer 24 is composed of silicon nitride (SiN). The sidewall insulation layer 25 and the interlayer insulation layer 26 are composed of silicon oxide (SiO₂).

In addition, a source-side hole 27 is formed to penetrate the source-side isolation/insulation layer 24, the source-side second insulation layer 23, the source-side conductive layer 22, and the source-side first insulation layer 21. A source-side gate insulation layer 28 and a source-side columnar semiconductor layer 29 are sequentially provided on the sidewall facing the source-side hole 27.

The source-side gate insulation layer 28 is formed by silicon oxide (SiO₂). The source-side columnar semiconductor layer 29 is formed by polysilicon (p-Si).

Note that the configuration of the source-side conductive layer 22 in the source-side selection transistor layer 20 is restated as follows: the source-side conductive layer 22 is formed to sandwich the source-side gate insulation layer 28 with the source-side columnar semiconductor layer 29.

In addition, in the source-side selection transistor layer 20, the source-side conductive layer 22 functions as the source-side selection gate line SGS. Further, the source-side conductive layer 22 functions as the control gate of the source-side selection transistor SSTrmn.

The memory transistor layer 30 has first to fifth inter-wordline insulation layers 31a to 31e that are provided over the source-side isolation/insulation layer 24 and the interlayer insulation layer 26, first to fourth word-line conductive layers 32a to 32d that are provided one above the other with the first to fifth inter-wordline insulation layers 31a to 31e, as well as a memory isolation/insulation layer 33 and a memory protection insulation layer 34 that are sequentially laminated on the fifth inter-wordline insulation layer 31e.

The first to fifth inter-wordline insulation layers 31a to 31e, the first to fourth word-line conductive layers 32a to 32d, as well as the memory isolation/insulation layer 33 are each formed to expand in a two-dimensional manner at the memory transistor area 12 in the row and column directions. The first to fifth inter-wordline insulation layers 31a to 31e, the first to fourth word-line conductive layers 32a to 32d, as well as the memory isolation/insulation layer 33 are formed in a stepwise manner in relation to each other at their row-direction ends, as indicated by "Sta1" in FIG. 4. The memory protection insulation layer 34 is continuously formed over the first to fifth inter-wordline insulation layers 31a to 31e, the first to fourth word-line conductive layers 32a to 32d, as well as the memory isolation/insulation layer 33, so that it covers their row- and column-direction ends. In addition, an interlayer insulation layer 35 is formed ranging from the top surface of the memory protection insulation layer 34 formed on the top surface of the first inter-wordline insulation layer 31a to the top surface of the memory protection insulation layer 34 formed on the top surface of the memory isolation/insulation layer 33.

The first to fifth inter-wordline insulation layers 31a to 31e are composed of silicon oxide (SiO₂). The first to fourth word-line conductive layers 32a to 32d are composed of p⁺ type polysilicon (p-Si). The memory isolation/insulation layer 33 and the memory protection insulation layer 34 are composed of silicon nitride (SiN). The interlayer insulation layer 35 is composed of silicon oxide (SiO₂).

In addition, the memory transistor layer 30 has a memory hole 36 formed therein so as to penetrate the memory isolation/insulation layer 33, the first to fifth inter-wordline insulation layers 31a to 31e, and the first to fourth word-line conductive layers 32a to 32d. The memory hole 36 is provided at a position matching the source-side hole 27. A memory gate insulation layer 37 and a memory columnar semiconductor layer 38 are sequentially provided on the sidewall of the memory hole 36.

Figure 5:
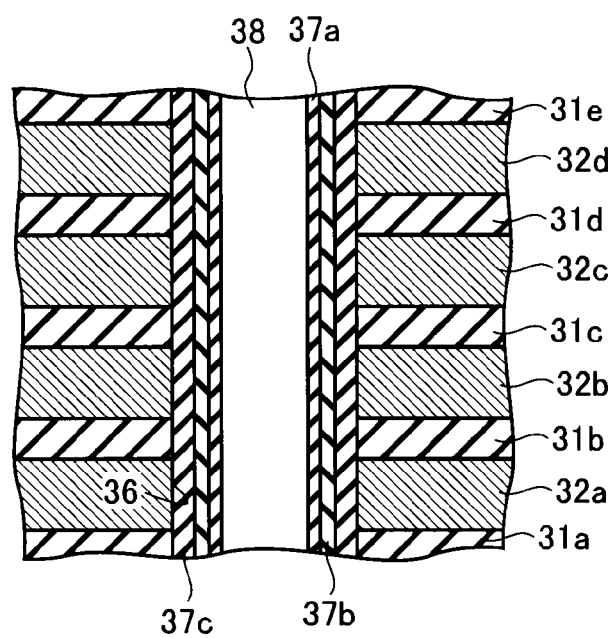
FIG. 5 is a partial enlarged view of FIG. 4.

The memory gate insulation layer 37 is configured as illustrated in FIG. 5. FIG. 5 is an enlarged view of the memory transistor layer 30 illustrated in FIG. 4. As illustrated in FIG. 5, the memory gate insulation layer 37 has a tunnel insulation layer 37a, a charge accumulation layer 37b for accumulating charges, and a block insulation layer 37c that are sequentially formed on the sidewall of the memory columnar semiconductor layer 38.

The tunnel insulation layer 37a and the block insulation layer 37c are formed by silicon oxide (SiO₂). The charge accumulation layer 37b is formed by silicon nitride (SiN). The memory columnar semiconductor layer 38 is composed of polysilicon (p-Si). In addition, the upper portion of the memory columnar semiconductor layer 38 may be composed of n⁺ type polysilicon.

Note that the configuration of the first to fourth word-line conductive layers 32a to 32d in the memory transistor layer 30 is restated as follows: each of the first to fourth word-line conductive layers 32a to 32d is formed to sandwich the tunnel insulation layer 37a, the charge accumulation layer 37b, and the block insulation layer 37c with the memory columnar semiconductor layer 38. In addition, the memory columnar semiconductor layer 38 is formed in contact with the top surface of the source-side columnar semiconductor layer 29 and the bottom surface of a drain-side columnar semiconductor layer 48 described below.

In addition, in the memory transistor layer 30, the first to fourth word-line conductive layers 32a to 32d function as the word lines WL1 to WL4. Further, the first to fourth word-line conductive layers 32a to 32d function as the control gates of the memory transistors MTrmn.

The drain-side selection transistor layer 40 has a drain-side first insulation layer 41, a drain-side conductive layer 42, a drain-side second insulation layer 43, and a drain-side isolation/insulation layer 44 that are sequentially laminated on the memory protection insulation layer 34.

The drain-side first insulation layer 41, the drain-side conductive layer 42, the drain-side second insulation layer 43, and the drain-side isolation/insulation layer 44 are provided at positions matching the upper portion of the memory columnar semiconductor layer 38, and formed to extend in the row direction and formed in lines repeatedly provided in the column direction. In addition, an interlayer insulation layer 45 is formed ranging from the respective top surfaces of the interlayer insulation layer 35 and the memory protection insulation layer 34 to a predetermined height above the drain-side isolation/insulation layer 44.

The drain-side first insulation layer 41 and the drain-side second insulation layer 43 are formed by silicon oxide ($SiO_2$). The drain-side conductive layer 42 is formed by $p^+$ type polysilicon (p-Si). The drain-side isolation/insulation layer 44 is formed by silicon nitride (SiN). The interlayer insulation layer 45 is formed by silicon oxide ($SiO_2$).

In addition, the drain-side selection transistor layer 40 has a drain-side hole 46 formed therein so as to penetrate the drain-side isolation/insulation layer 44, the drain-side second insulation layer 43, the drain-side conductive layer 42, the drain-side first insulation layer 41, and the memory protection insulation layer 34. The drain-side hole 46 is provided at a position matching the memory hole 36. A drain-side gate insulation layer 47 and a drain-side columnar semiconductor layer 48 are sequentially provided on the sidewall facing the drain-side hole 46.

The drain-side gate insulation layer 47 is formed by silicon oxide ($SiO_2$). The drain-side columnar semiconductor layer 48 is formed by polysilicon (p-Si). In addition, the upper portion of the drain-side columnar semiconductor layer 48 is composed of $n^+$ type polysilicon.

Note that the configuration of the drain-side conductive layer 42 in the drain-side selection transistor layer 40 is restated as follows: the drain-side conductive layer 42 is formed to sandwich the drain-side gate insulation layer 47 with the drain-side columnar semiconductor layer 48. In addition, the drain-side columnar semiconductor layer 48 is formed in contact with the top surface of the memory columnar semiconductor layer 38.

In addition, in the drain-side selection transistor layer 40, the drain-side conductive layer 42 functions as a drain-side selection gate line SGD. Further, the drain-side conductive layer 42 functions as the control gate of a drain-side selection transistor SDTrmn.

Further, contact holes 51a to 51h are formed downward from the top surface in the source-side selection transistor layer 20, the memory transistor layer 30, and the drain-side selection transistor layer 40.

The contact hole 51a is formed from the top surface to the $n^+$ area Ba2. The contact hole 51b is formed to reach the top surface of the source-side conductive layer 22. The contact holes 51c to 51f is formed to reach the top surface of the first to fourth word-line conductive layers 32a to 32d. The contact hole 51g is formed to reach the top surface of the drain-side conductive layer 42. The contact hole 51h is formed to reach the top surface of the drain-side columnar semiconductor layer 48.

The contact holes 51a to 51h have connecting conductive layers 54 formed therein. The connecting conductive layers 54 are formed to extend from the upper layer to the lower layer of the memory transistor layer 30. The connecting conductive layers 54 have barrier metal layers 52 and metal layers 53. The barrier metal layers 52 are formed on the sidewalls facing the contact holes 51a to 51h. The metal layers 53 are formed in contact with the sidewalls of the barrier metal layers 52. The barrier metal layers 52 are composed of titanium (Ti)/titanium nitride (TiN). The metal layers 53 are composed of tungsten (W).

The configuration of the peripheral area Ph (the first CMP dummy layer 60 and the second CMP dummy layer 70) will now be described below.

A device isolation/insulation layer Ba3 is formed in the peripheral area Ph at the memory transistor area 12 side on the semiconductor substrate Ba. Note that, as in the memory transistor area 12, the p-type area Ba1 and the $n^+$ area Ba2 are provided on the semiconductor substrate Ba.

The first CMP dummy layer 60 has a dummy source-side first insulation layer 61, a dummy source-side conductive layer 62, a dummy source-side second insulation layer 63, and a dummy source-side isolation/insulation layer 64 that are sequentially laminated on the semiconductor substrate Ba.

The dummy source-side first insulation layer 61, the dummy source-side conductive layer 62, the dummy source-side second insulation layer 63, and the dummy source-side isolation/insulation layer 64 are each formed to expand in a two-dimensional manner at the peripheral area Ph in the horizontal direction parallel to the semiconductor substrate Ba. A sidewall insulation layer 65 is formed on the row- and column-direction ends of the dummy source-side first insulation layer 61, the dummy source-side conductive layer 62, the dummy source-side second insulation layer 63, and the dummy source-side isolation/insulation layer 64. In addition, an interlayer insulation layer 66 is formed ranging from the top of the semiconductor substrate Ba to the top surface of the dummy source-side isolation/insulation layer 64.

The dummy source-side first insulation layer 61 is formed in the same layer as the source-side first insulation layer 21. The dummy source-side conductive layer 62 is formed in the same layer as the source-side conductive layer 22. The dummy source-side second insulation layer 63 is formed in the same layer as the source-side second insulation layer 23. The dummy source-side isolation/insulation layer 64 is formed in the same layer as the source-side isolation/insulation layer 24. The interlayer insulation layer 66 is formed integrally and continuously with the interlayer insulation layer 26 in the memory transistor area 12. In other words, the interlayer insulation layer 66 is formed in the same layer as the interlayer insulation layer 26 in the memory transistor area 12.

The dummy source-side first insulation layer 61 and the dummy source-side second insulation layer 63 are composed of silicon oxide ($SiO_2$). The dummy source-side conductive layer 62 is composed of $p^+$ type polysilicon (p-Si). The dummy source-side isolation/insulation layer 64 is composed of silicon nitride (SiN). The sidewall insulation layer 65 and the interlayer insulation layer 66 are composed of silicon oxide ($SiO_2$).

The dummy source-side conductive layer 62 functions as, e.g., the gate of a high breakdown voltage MOS transistor provided in the peripheral area Ph. Note that the source, drain, etc., of that high breakdown voltage MOS transistor are omitted from FIG. 4.

The second CMP dummy layer 70 has dummy first to fifth inter-wordline insulation layers 71a to 71e, dummy first to fourth word-line conductive layers 72a to 72d that are provided one above the other with the dummy first to fifth inter-wordline insulation layers 71a to 71e, as well as a dummy memory isolation/insulation layer 73 and a dummy memory protection insulation layer 74 that are sequentially laminated on the dummy fifth inter-wordline insulation layer 71e.

The dummy first to fifth inter-wordline insulation layers 71a to 71e, the dummy first to fourth word-line conductive layers 72a to 72d, as well as the dummy memory isolation/insulation layer 73 are each formed to expand in a two-dimensional manner at the peripheral area Ph in the row and column directions. In addition, they are formed in a stepwise manner in relation to each other at their row-direction ends on the memory transistor layer 30 side, as indicated by "Sta2" in FIG. 4. The dummy memory protection insulation layer 74 is continuously formed over the dummy first to fifth inter-wordline insulation layers 71a to 71e, the dummy first to fourth word-line conductive layers 72a to 72d, as well as the dummy memory isolation/insulation layer 73, so that it covers their row- and column-direction ends. In addition, an interlayer insulation layer 75 is formed ranging from the top surface of the dummy memory protection insulation layer 74 formed on the top surface of the dummy first inter-wordline insulation layer 71a to the top surface of the dummy memory protection insulation layer 74 formed on the top surface of the dummy memory isolation/insulation layer 73.

In addition, an interlayer insulation layer 76 is formed ranging from the respective top surfaces of the second CMP dummy layer 70 (the interlayer insulation layer 75) and the dummy memory protection insulation layer 74, to a predetermined height thereabove.

The dummy first inter-wordline insulation layer 71a is formed integrally and continuously with the first inter-wordline insulation layer 31a. The dummy first inter-wordline insulation layer 71a is formed in the same layer as the first inter-wordline insulation layer 31a. The dummy second to fifth inter-wordline insulation layers 71b to 71e is formed in the same layer as the second to fifth inter-wordline insulation layers 31b to 31e. The dummy memory isolation/insulation layer 73 is formed in the same layer as the memory isolation/insulation layer 33. The dummy memory protection insulation layer 74 is formed integrally and continuously with the memory protection insulation layer 34.

The interlayer insulation layer 75 is formed integrally and continuously with the interlayer insulation layer 35 provided in the memory transistor area 12. The interlayer insulation layer 76 is formed integrally and continuously with the interlayer insulation layer 45 provided in the memory transistor area 12.

The dummy first to fifth inter-wordline insulation layers 71a to 71e are composed of silicon oxide ($SiO_2$). The dummy first to fourth word-line conductive layers 72a to 72d are composed of $p^+$ type polysilicon (p-Si). The dummy memory isolation/insulation layer 73 and the dummy memory protection insulation layer 74 are composed of silicon nitride (SiN). The interlayer insulation layers 75 and 76 are composed of silicon oxide ($SiO_2$).

In addition, wiring areas Ar1 of the second CMP dummy layer 70 have holes 77 (first through holes) formed therein so as to penetrate the dummy first to fifth inter-wordline insulation layers 71a to 71e, the dummy first to fourth word-line conductive layers 72a to 72d, the dummy memory isolation/insulation layer 73, and the dummy memory protection insulation layer 74. The holes 77 are provided with (filled up with) in-hole insulation layers (interlayer insulation layers) 78. The in-hole insulation layers 78 are composed of silicon oxide ($SiO_2$). Note that the wiring areas Ar1 represent those areas in which connecting conductive layers 84 are provided, as described below. That is, the in-hole insulation layers 78 are formed to surround the side surfaces of the connecting conductive layers 84. In addition, the wiring areas Ar1 are formed to be filled up with the connecting conductive layers 84 and the in-hole insulation layers 78.

Further, contact holes (second through holes) 81a and 81b are formed downward from the top surface in the first CMP dummy layer 60 and the second CMP dummy layer 70.

The contact hole 81a is formed to reach the $n^+$ area Ba2. The contact hole 81a is formed to penetrate the interlayer insulation layer 76, the in-hole insulation layer 78, the dummy first inter-wordline insulation layer 71a, and the interlayer insulation layer 66.

The contact hole 81b is formed to reach the top surface of the dummy source-side conductive layer 62. The contact hole 81b is formed to penetrate the interlayer insulation layer 76, the in-hole insulation layer 78, the dummy first inter-wordline insulation layer 71a, the dummy source-side isolation/insulation layer 64, and the dummy source-side second insulation layer 63.

The contact holes 81a and 81b have the connecting conductive layers 84 formed therein. The connecting conductive layers 84 are formed to extend from the upper layer to the lower layer of the second CMP dummy layer 70. The connecting conductive layers 84 have barrier metal layers 82 and metal layers 83. The barrier metal layers 82 are formed on the sidewalls facing the contact holes 81a and 81b. The metal layers 83 are formed in contact with the side surfaces of the barrier metal layers 82. The barrier metal layers 82 are composed of titanium (Ti)/titanium nitride (TiN). The metal layers 83 are composed of tungsten (W).

The above configuration is restated as follows: the respective ends of the dummy first to fourth word-line conductive layers 72a to 72d are formed to align along a straight line, extending in the direction substantially perpendicular to the semiconductor substrate Ba, at the wiring areas (predetermined areas) Ar1 in which the connecting conductive layers 84 extending from the upper layer to the lower layer of the second CMP dummy layer 70 are provided. Although the term "substantially perpendicular" used herein assumes in particular a range of angles, on the order of 85° to 91°, such need not be the case. Similarly, the term "align along" should also be construed to include a certain convex and concave pattern.

Manufacturing Process of Non-Volatile Semiconductor Storage Device 100 in First Embodiment Referring now to FIGS. 6 to 17, the manufacturing process of the non-volatile semiconductor storage device 100 according to the first embodiment will be described below.

Firstly, a source-side selection transistor layer 20 and a first CMP dummy layer 60 are formed on the semiconductor substrate Ba. Then, first to fifth plate-like insulation layers 31a' to 31e' and first to fourth plate-like conductive layers 32a' to 32d' are alternately deposited on the source-side selection transistor layer 20 and the first CMP dummy layer 60, after which a plate-like isolation/insulation layer 33' is further deposited thereon. That is, prior to forming the first to fourth plate-like conductive layers 32a' to 32d', a dummy source-side conductive layer 62 is formed that extends parallel to the semiconductor substrate Ba.

Figure 6:
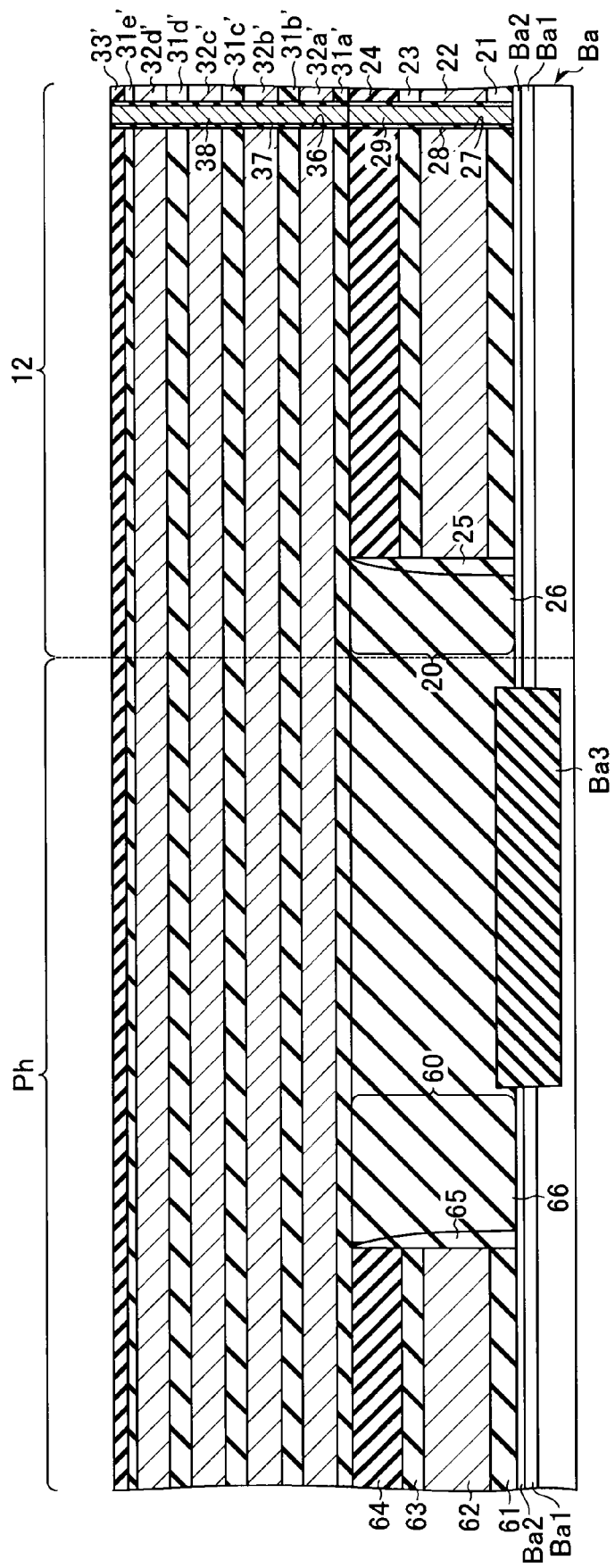
FIG. 6 is a cross-sectional view of the non-volatile semiconductor storage device 100 in a manufacturing process according to the first embodiment.

Then, a memory hole 36 is formed in the memory transistor area 12 so as to penetrate the first to fifth plate-like insulation layers 31a' to 31e', the first to fourth plate-like conductive layers 32a' to 32d', as well as the plate-like isolation/insulation layer 33'. Thereafter, a memory gate insulation layer 37 and a memory columnar semiconductor layer 38 are formed in the memory hole 36. Through this process, the lamination structure is formed as illustrated in FIG. 6.

Figure 7:
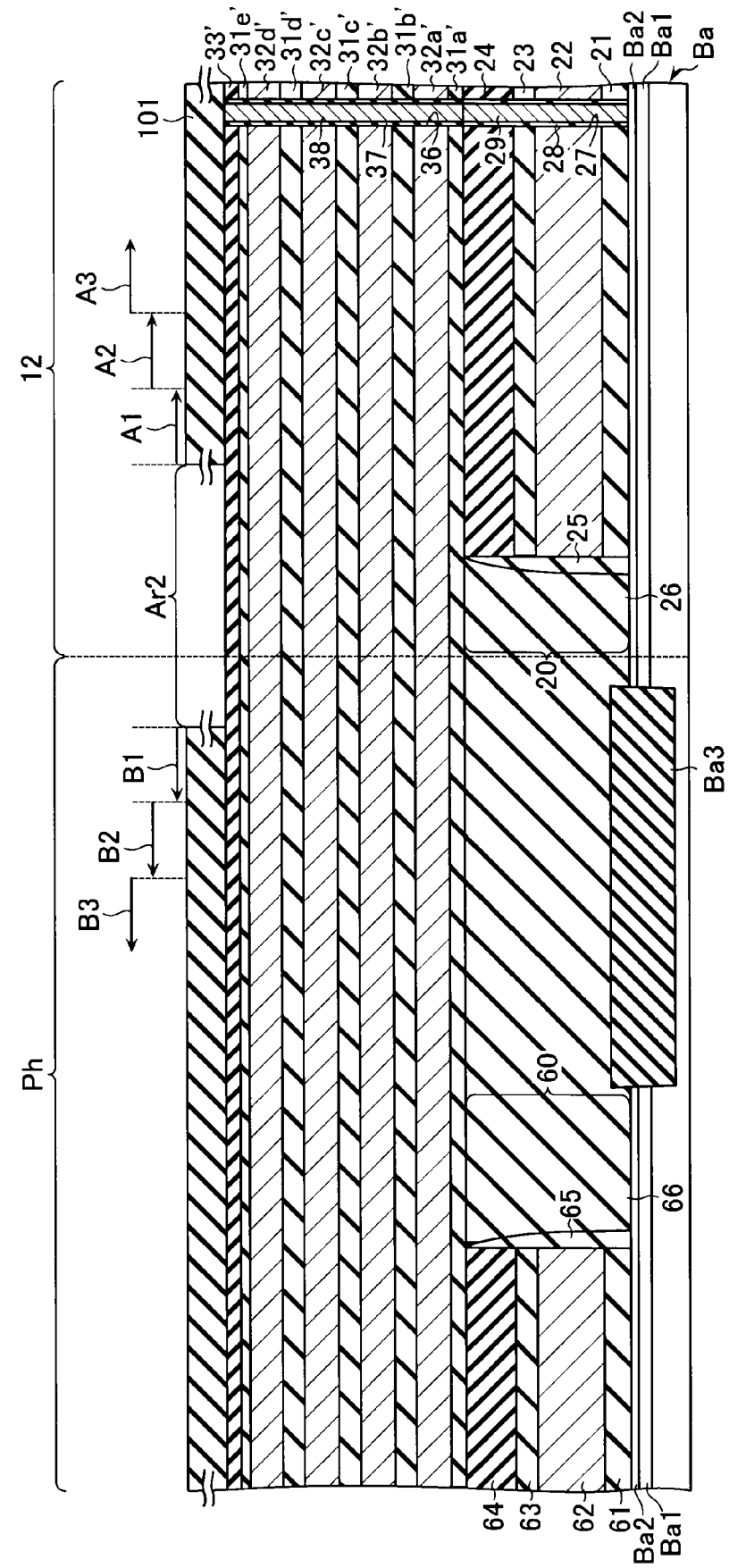
FIG. 7 is a cross-sectional view of the non-volatile semiconductor storage device 100 in the manufacturing process according to the first embodiment.

Then, as illustrated in FIG. 7, a resist 101 is formed on the plate-like isolation/insulation layer 33', excluding the area Ar2 that corresponds to the boundary between the memory transistor area 12 and the peripheral area Ph. In this case, for example, the resist 101 is formed with a thickness of about 3 μm. The resist 101 is used as a mask for etching. Then, etching is performed using the resist 101 as a mask, while slimming down the resist 101 in the directions indicated by the arrows A1 to A3 and B1 to B3, respectively. Note that the resist 101 is removed after the etching.

Figure 8:
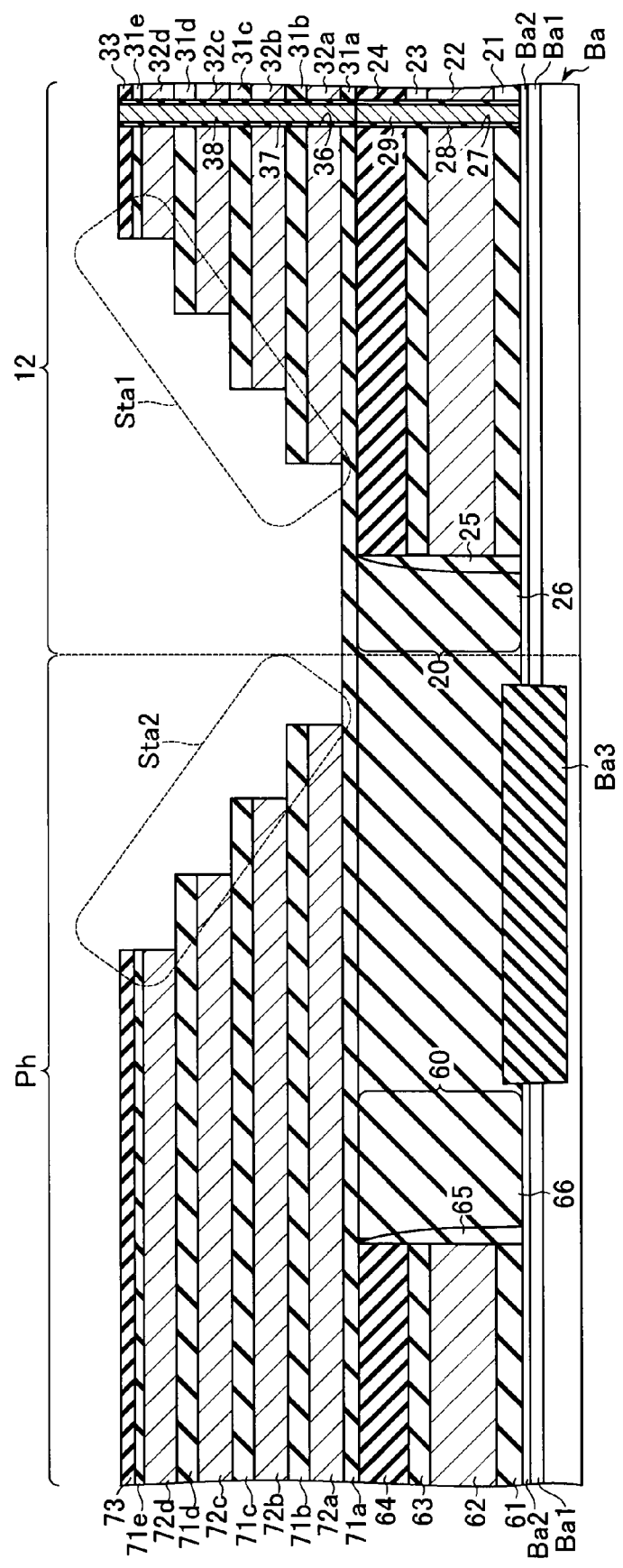
FIG. 8 is a cross-sectional view of the non-volatile semiconductor storage device 100 in the manufacturing process according to the first embodiment.

Through the process illustrated in FIG. 7, the lamination structure is formed as illustrated in FIG. 8. That is, the first to fifth plate-like insulation layers 31a' to 31e' become the first to fifth inter-wordline insulation layers 31a to 31e that expand in a two-dimensional manner at the memory transistor area 12. The first to fourth plate-like conductive layers 32a' to 32d' become the first to fourth word-line conductive layers 32a to 32d that expand in a two-dimensional manner at the memory transistor area 12. The plate-like isolation/insulation layer 33' becomes the memory isolation/insulation layer 33 that expands in a two-dimensional manner at the memory transistor area 12. In addition, through the process illustrated in FIG. 7, the first to fifth inter-wordline insulation layers 31a to 31e, the first to fourth word-line conductive layers 32a to 32d, as well as the memory isolation/insulation layer 33 are formed in a stepwise manner in relation to each other at their row-direction ends (as indicated by "Sta1" in FIG. 8).

Similarly, the first to fifth plate-like insulation layers 31a' to 31e' become the dummy first to fifth inter-wordline insulation layers 71a to 71e that expand in a two-dimensional manner at the peripheral area Ph. The first to fourth plate-like conductive layers 32a' to 32d' become the dummy first to fourth word-line conductive layers 72a to 72d that expand in a two-dimensional manner at the peripheral area Ph. The plate-like isolation/insulation layer 33' becomes the dummy memory isolation/insulation layer 73 that expands in a two-dimensional manner at the peripheral area Ph. In addition, through the process illustrated in FIG. 7, the dummy first to fifth inter-wordline insulation layers 71a to 71e, the dummy first to fourth word-line conductive layers 72a to 72d, as well as the dummy memory isolation/insulation layer 73 are formed in a stepwise manner in relation to each other at their row-direction ends on the memory transistor layer 30 side (as indicated by "Sta2" in FIG. 8).

Figure 9:
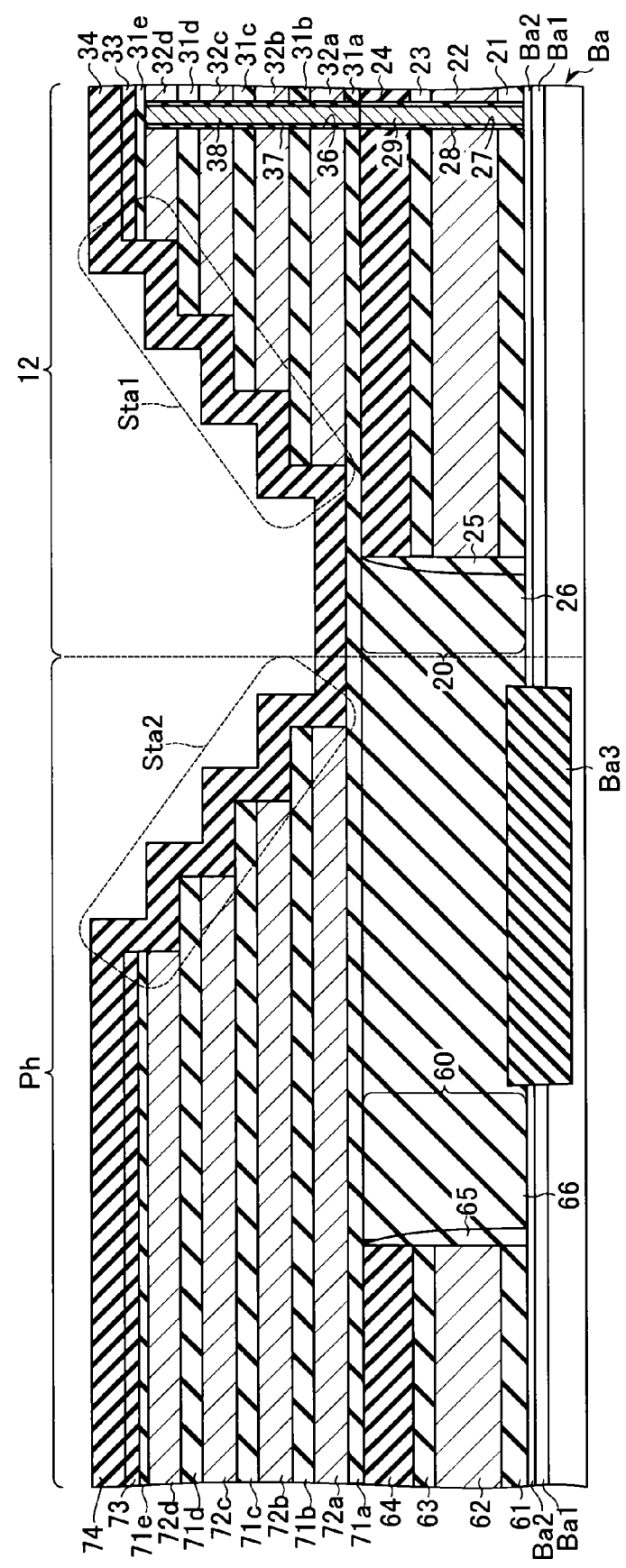
FIG. 9 is a cross-sectional view of the non-volatile semiconductor storage device 100 in the manufacturing process according to the first embodiment.

Then, silicon nitride (SiN) is deposited as illustrated in FIG. 9 to form a memory protection insulation layer 34 and a dummy memory protection insulation layer 74. Note that the memory protection insulation layer 34 and the dummy memory protection insulation layer 74 are integrally formed with each other. The memory protection insulation layer 34 is formed to cover the first to fifth inter-wordline insulation layers 31a to 31e, the first to fourth word-line conductive layers 32a to 32d, as well as the memory isolation/insulation layer 33. In addition, the dummy memory protection insulation layer 74 is formed to cover the first to fifth inter-wordline insulation layers 71a to 71e, the dummy first to fourth word-line conductive layers 72a to 72d, as well as the dummy memory isolation/insulation layer 73.

Figure 10:
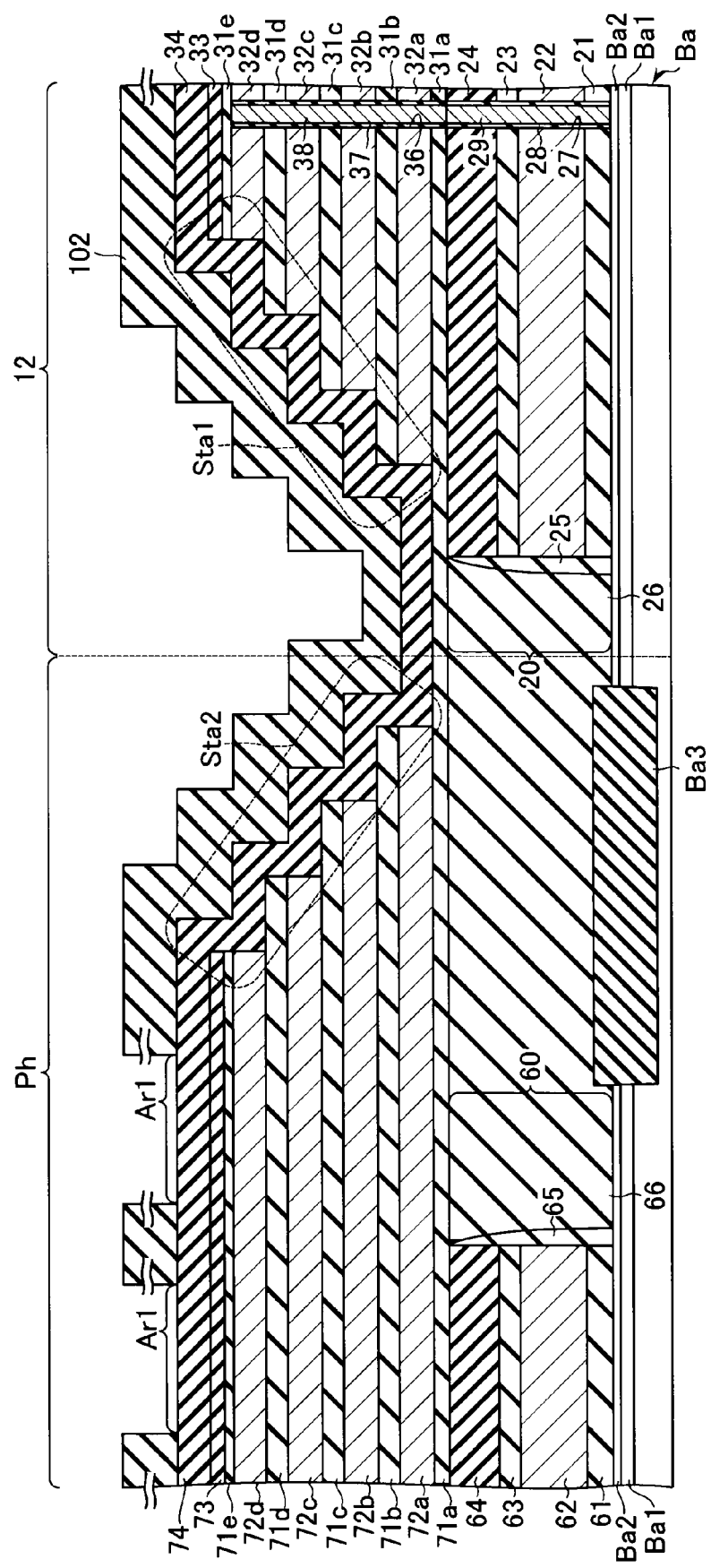
FIG. 10 is a cross-sectional view of the non-volatile semiconductor storage device 100 in the manufacturing process according to the first embodiment.

Then, a resist 102 is formed as illustrated in FIG. 10. The resist 102 is formed on the memory protection insulation layer 34 and the dummy memory protection insulation layer 74, excluding those areas for the wiring areas Ar1.

Figure 11:
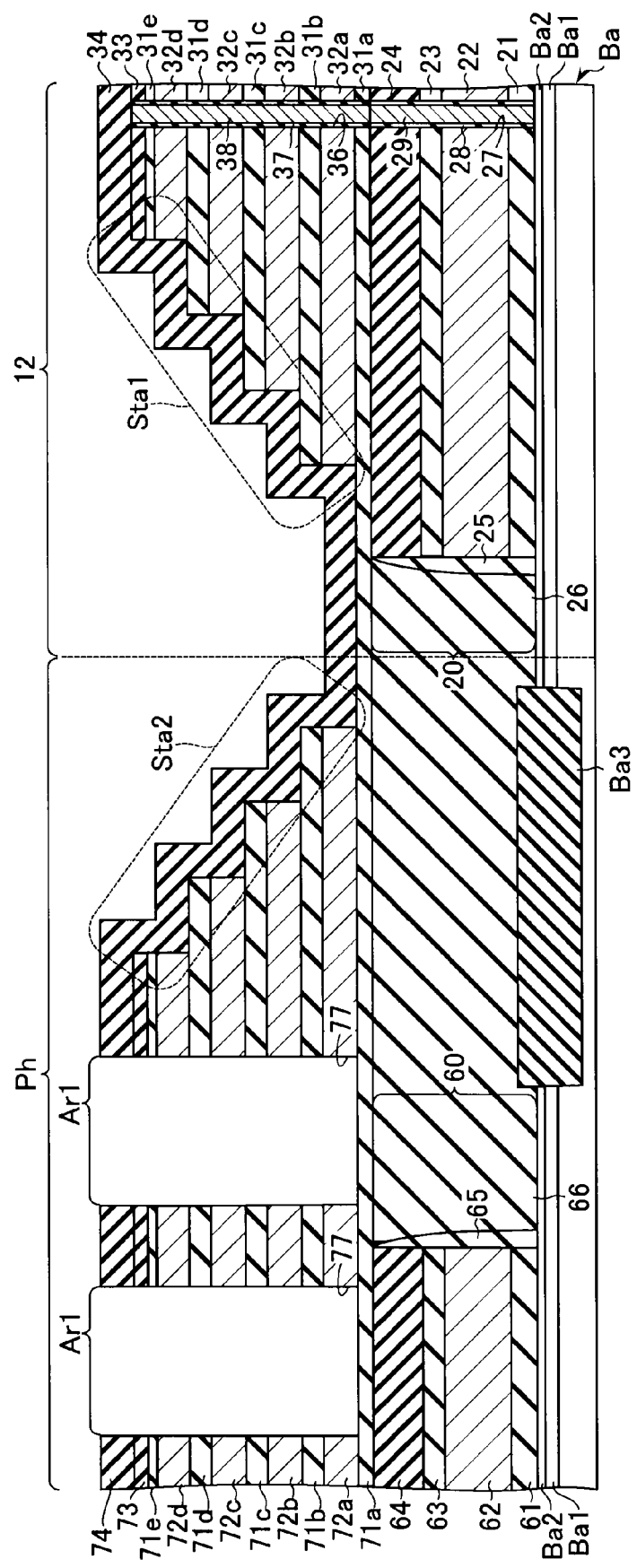
FIG. 11 is a cross-sectional view of the non-volatile semiconductor storage device 100 in the manufacturing process according to the first embodiment.

Then, as illustrated in FIG. 11, the resist 102 is used as a mask to form holes (first through holes) 77 in the wiring areas Ar1 so as to penetrate the dummy second to fifth inter-wordline insulation layers 71b to 71e, the dummy first to fourth word-line conductive layers 72a to 72d, the dummy memory isolation/insulation layer 73, and the dummy memory protection insulation layer 74. After forming the holes 77, the resist 102 are removed.

Figure 12:
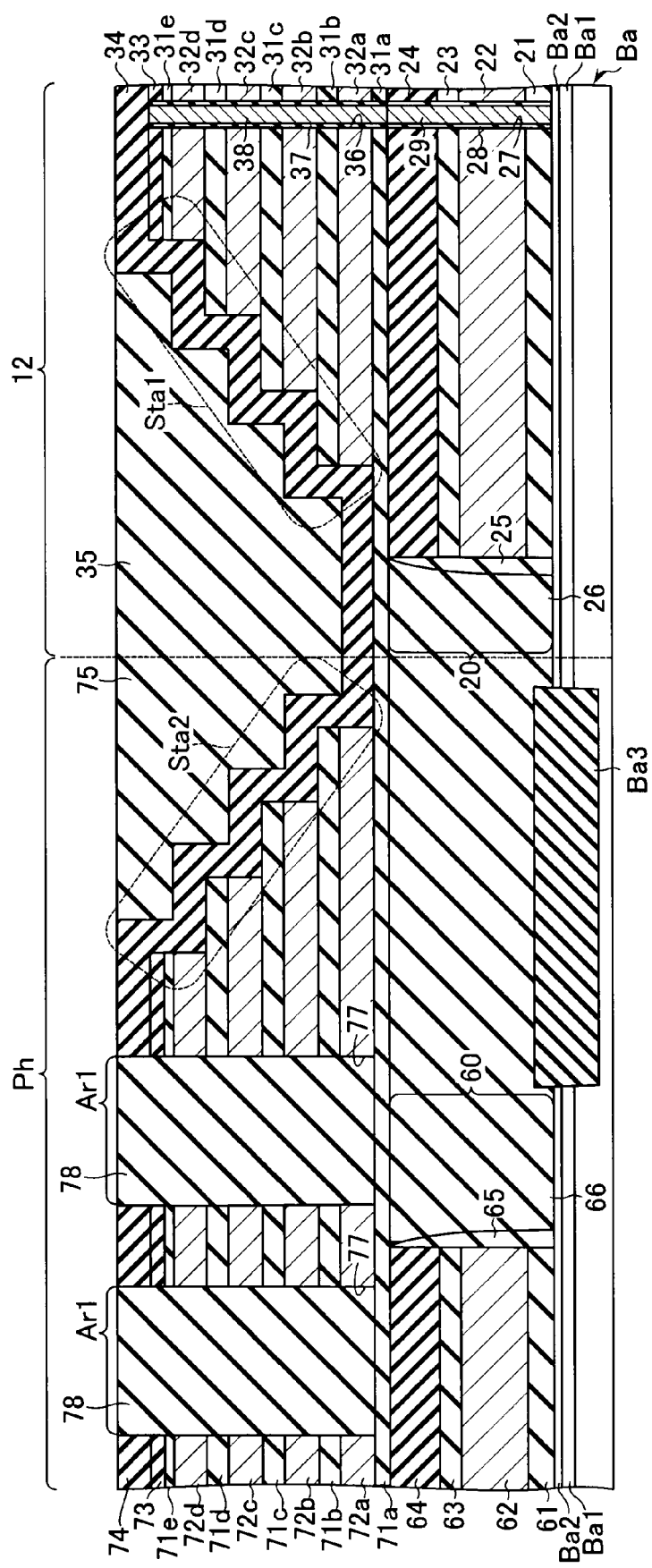
FIG. 12 is a cross-sectional view of the non-volatile semiconductor storage device 100 in the manufacturing process according to the first embodiment.

Then, silicon oxide (SiO$_2$) is deposited as illustrated in FIG. 12 and CMP is performed to form interlayer insulation layers 35, 75, and in-hole insulation layers 78. Note that the interlayer insulation layer 35 and the interlayer insulation layer 75 are integrally formed with each other. In the step of FIG. 12, the interlayer insulation layer 35 is formed ranging from the top surface of the memory protection insulation layer 34 on the first inter-wordline insulation layer 31a to the top surface of the memory protection insulation layer 34 on the memory isolation/insulation layer 33. The interlayer insulation layer 75 is formed ranging from the top surface of the dummy memory protection insulation layer 74 on the dummy first inter-wordline insulation layers 71a to the top surface of the dummy memory protection insulation layer 74 on the dummy memory isolation/insulation layer 73. The in-hole insulation layers 78 are formed to fill up the holes 77 in the wiring areas Ar1.

In the step of FIG. 12, the memory protection insulation layer 34 functions as a stopper for CMP. Similarly, the dummy memory protection insulation layer 74 functions as a stopper that is used for making the polished surface of the memory transistor layer 30 parallel to a desired surface in flattening the memory transistor layer 30 by CMP.

Figure 13:
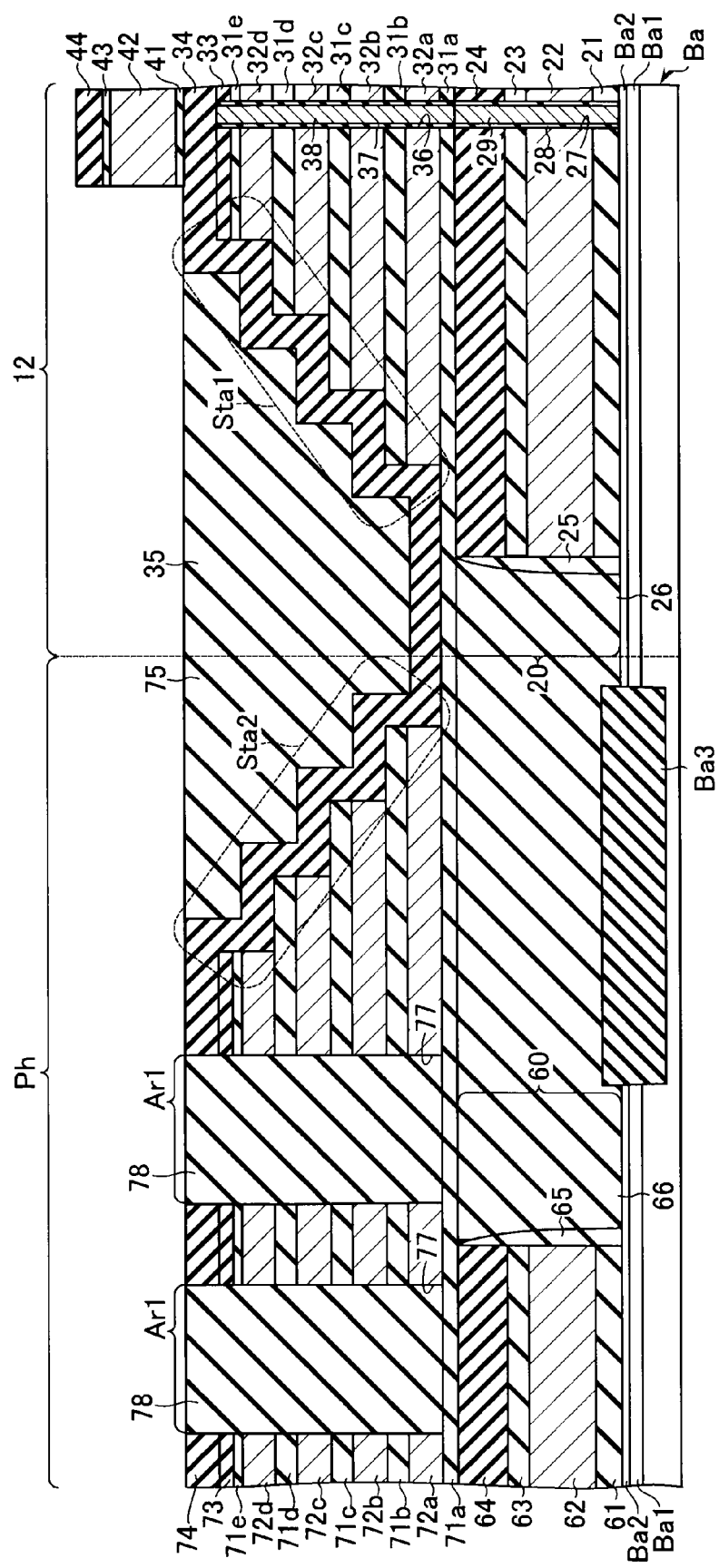
FIG. 13 is a cross-sectional view of the non-volatile semiconductor storage device 100 in the manufacturing process according to the first embodiment.

Then, as illustrated in FIG. 13, silicon oxide (SiO$_2$) polysilicon (p-Si), silicon oxide (SiO$_2$), and silicon nitride (SiN) are deposited on the memory protection insulation layer 34 within a predetermined area of the memory transistor area 12. Through this process, a drain-side first insulation layer 41, a drain-side conductive layer 42, a drain-side second insulation layer 43, and a drain-side isolation/insulation layer 44 are formed on the memory protection insulation layer 34 within the predetermined area of the memory transistor area 12.

Figure 14:
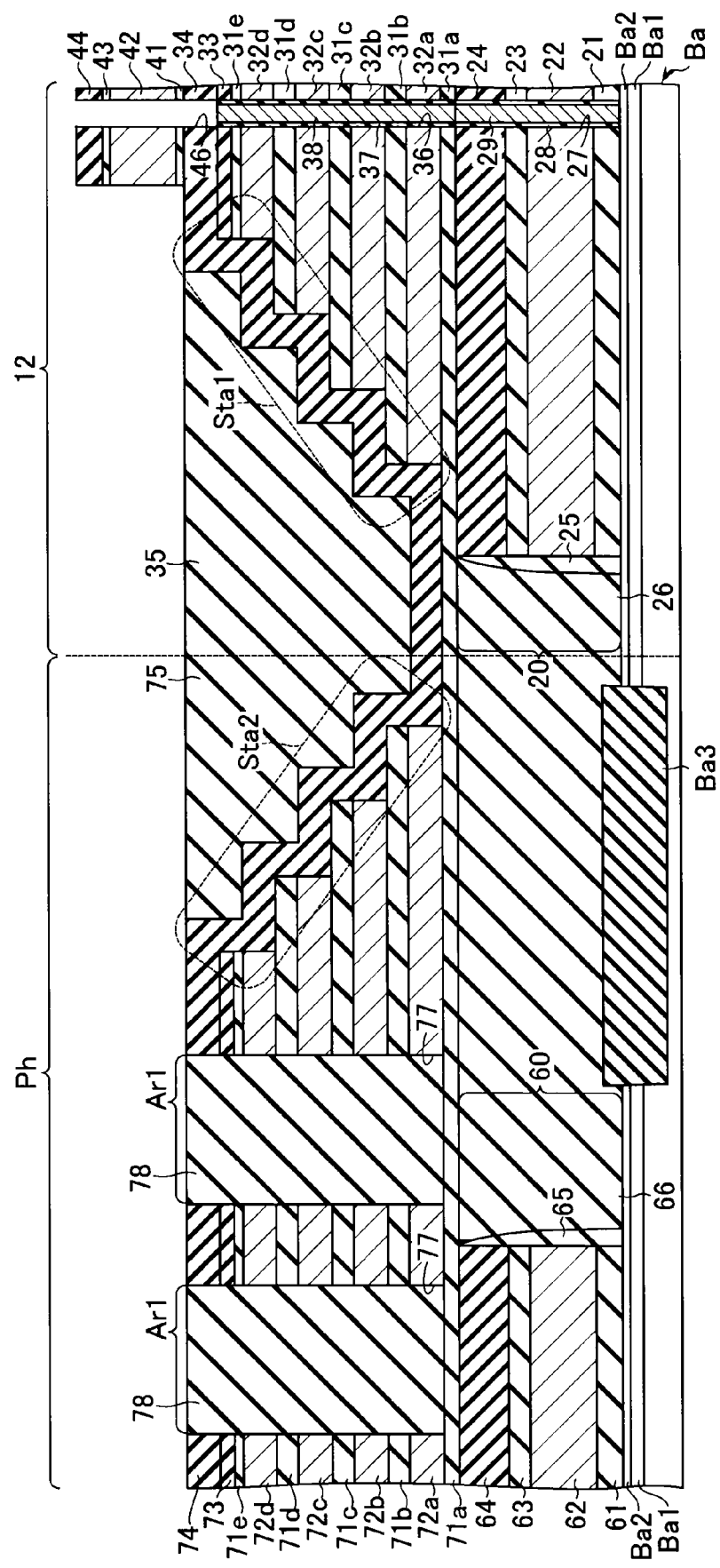
FIG. 14 is a cross-sectional view of the non-volatile semiconductor storage device 100 in the manufacturing process according to the first embodiment.

Then, as illustrated in FIG. 14, a drain-side hole 46 is formed to penetrate the memory protection insulation layer 34, the drain-side first insulation layer 41, the drain-side conductive layer 42, the drain-side second insulation layer 43, and the drain-side isolation/insulation layer 44. The drain-side hole 46 is formed at a position matching the memory hole 36.

Figure 15:
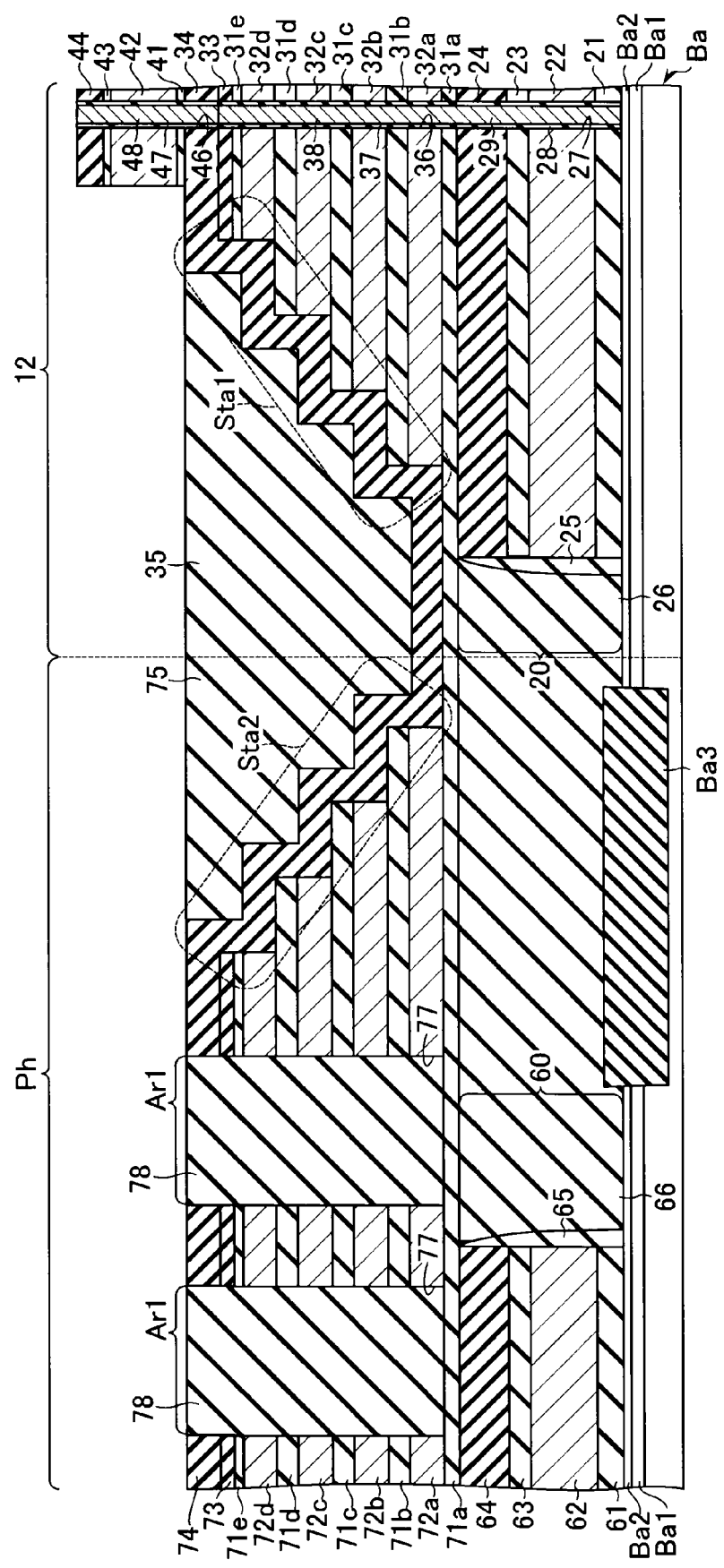
FIG. 15 is a cross-sectional view of the non-volatile semiconductor storage device 100 in the manufacturing process according to the first embodiment.

Then, as illustrated in FIG. 15, silicon oxide and polysilicon are deposited on the respective sidewalls, facing the drain-side hole 46, of the memory protection insulation layer 34, the drain-side first insulation layer 41, the drain-side conductive layer 42, the drain-side second insulation layer 43, and the drain-side isolation/insulation layer 44, thereby forming a drain-side gate insulation layer 47 and a drain-side columnar semiconductor layer 48.

Figure 16:
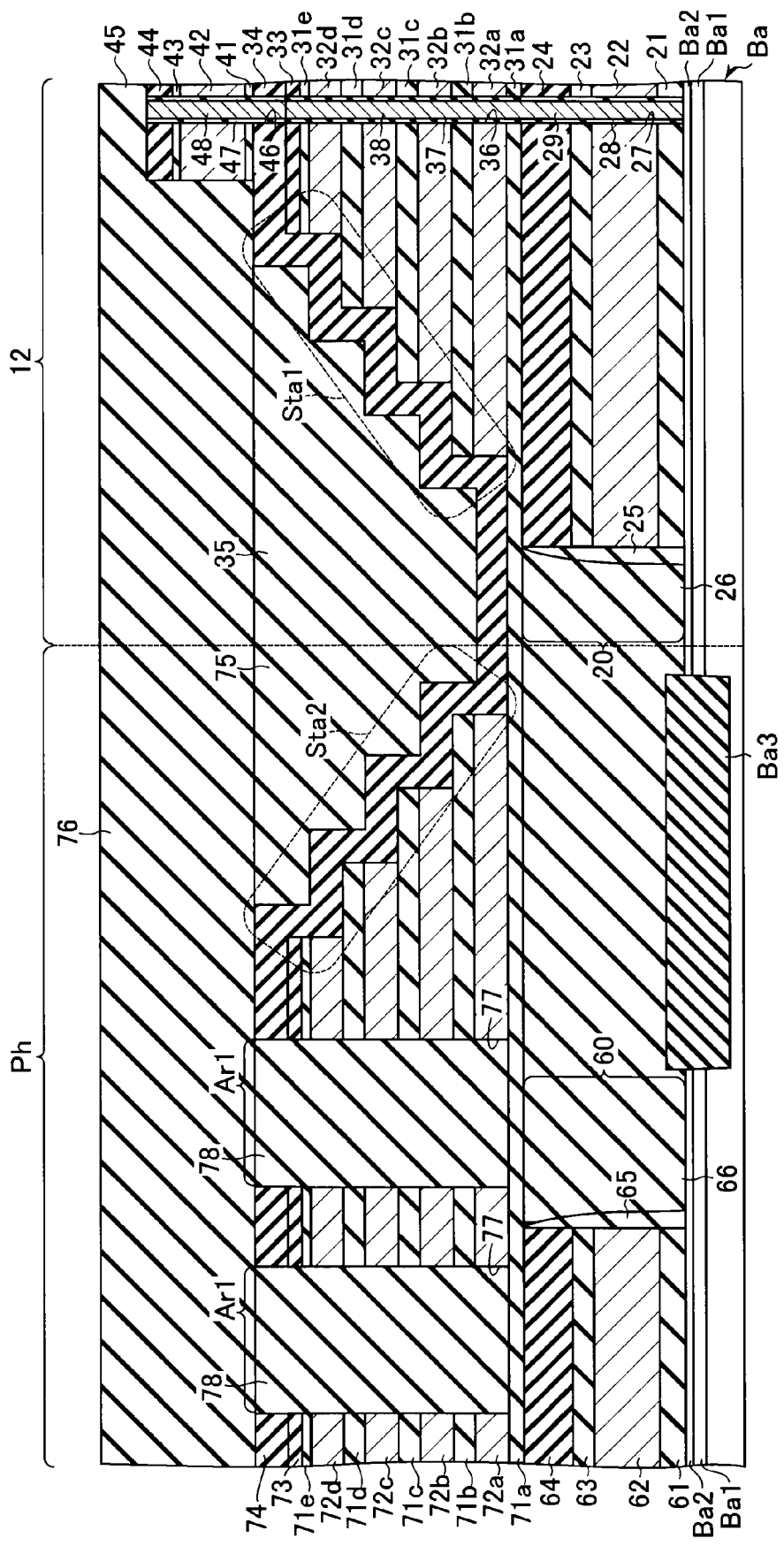
FIG. 16 is a cross-sectional view of the non-volatile semiconductor storage device 100 in the manufacturing process according to the first embodiment.

Then, silicon oxide (SiO$_2$) is deposited as illustrated in FIG. 16 to form an interlayer insulation layer 45 in the memory transistor area 12, while forming an interlayer insulation layer 76 in the peripheral area Ph. Note that the interlayer insulation layer 45 and the interlayer insulation layer 76 are integrally formed with each other.

Figure 17:
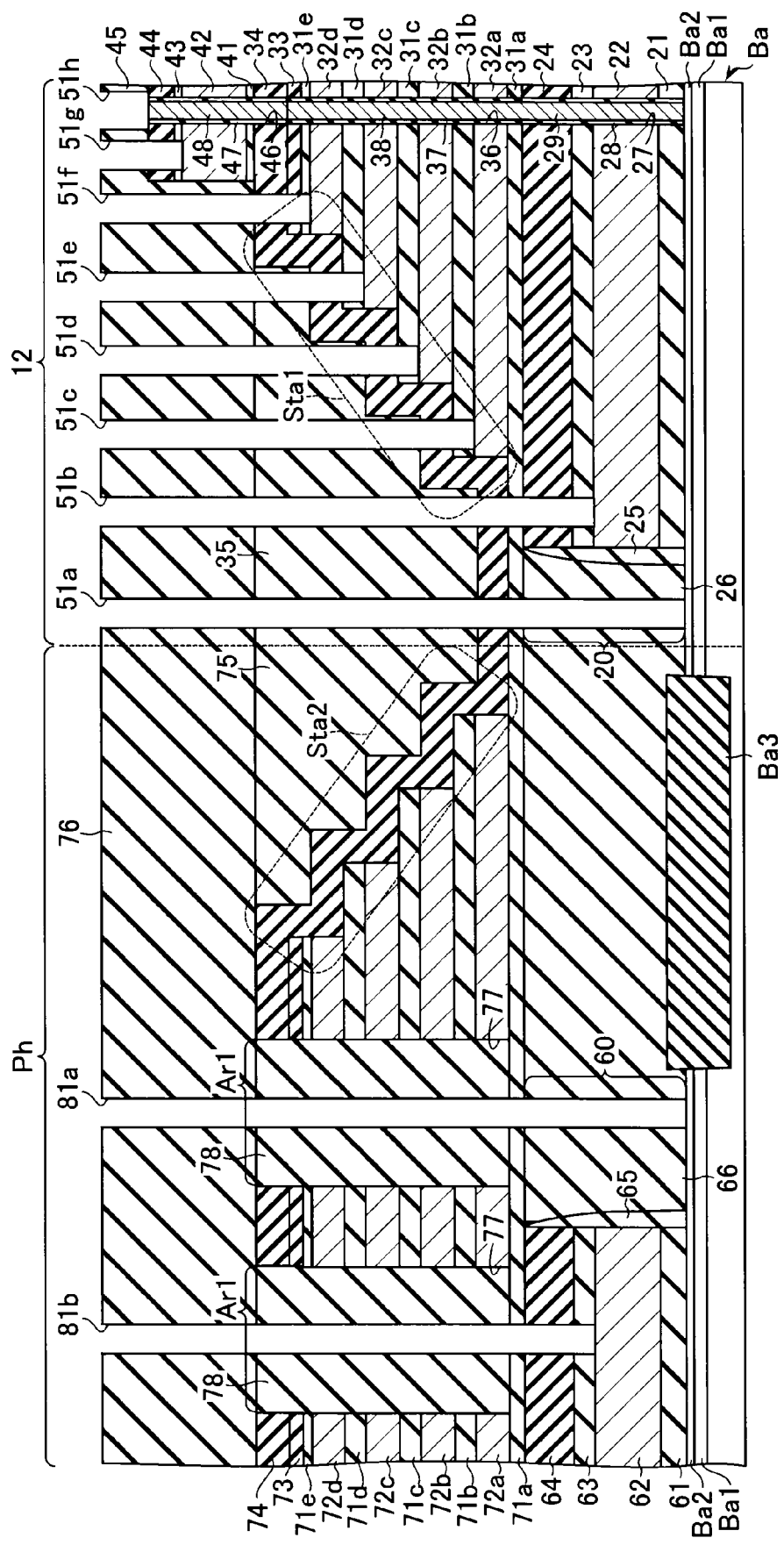
FIG. 17 is a cross-sectional view of the non-volatile semiconductor storage device 100 in the manufacturing process according to the first embodiment.

Then, as illustrated in FIG. 17, contact holes 51a to 51h are formed in the memory transistor area 12. The contact hole 51a is formed to reach the n+ area Ba2. The contact hole 51b is formed to reach the source-side conductive layer 22. The contact holes 51c to 51f are formed to reach the first to fourth word-line conductive layers 32a to 32d. The contact hole 51g is formed to reach the top surface of the drain-side conductive layer 42. The contact hole 51h is formed to reach the top surface of the drain-side columnar semiconductor layer 48.

In addition, as illustrated in FIG. 17, contact holes (second through holes) 81a and 81b are formed in the peripheral area Ph. The contact hole 81a is formed to reach the n+ area Ba2. The contact hole 81a is formed to penetrate the interlayer insulation layer 76, the in-hole insulation layers 78, the dummy first inter-wordline insulation layer 71a, and the interlayer insulation layer 66. The contact hole 81b is formed to reach the dummy source-side conductive layer 62. The contact hole 81b is formed to penetrate the interlayer insulation layer 76, the in-hole insulation layers 78, the dummy first inter-wordline insulation layer 71a, the dummy source-side isolation/insulation layer 64, and the dummy source-side second insulation layer 63.

Following the step of FIG. 17, titanium (Ti)/titanium nitride (TiN) and tungsten (W) are deposited within the contact holes 51a to 51h in the memory transistor area 12 and CMP is performed to form connecting conductive layers 54 (barrier metal layers 52 and metal layers 53). Simultaneously, titanium (Ti)/titanium nitride (TiN) and tungsten (W) are deposited within the contact holes 81a and 81b in the peripheral area Ph and then CMP is performed to form connecting conductive layers 84 (barrier metal layers 82 and metal layers 83). That is, one of the connecting conductive layers 84 is formed in contact with the top surface of the dummy source-side conductive layer 62. Through this process, the non-volatile semiconductor storage device 100 is formed as illustrated in FIG. 4.

The manufacturing process of the memory protection insulation layer 34 and the dummy memory protection insulation layer 74 according to the first embodiment can be restated as follows: in the first embodiment, the memory protection insulation layer 34 and the dummy memory protection insulation layer 74 are continuously formed over the first to fourth plate-like conductive layers 32a' to 32d', after the first to fourth plate-like conductive layers 32a' to 32d' are processed in a stepwise manner in relation to each other and before the holes 77 are formed.

Advantages of Non-Volatile Semiconductor Storage Device 100 in First Embodiment

Advantages of the non-volatile semiconductor storage device 100 according to the first embodiment will now be described below. As can be seen from the above, in the memory transistor layer 30 of the non-volatile semiconductor storage device 100 according to the first embodiment, the first to fourth word-line conductive layers 32a to 32d are formed in a stepwise manner in relation to each other at their row-direction ends. On the other hand, in the second CMP dummy layer 70, the respective ends of the dummy first to fourth word-line conductive layers 72a to 72d are formed to align along a straight line, extending in the direction substantially perpendicular to the semiconductor substrate Ba, at the wiring areas Ar1.

Here, consider a comparative example to explain the advantages of the first embodiment. It is assumed that the respective ends of dummy first to fourth word-line conductive layers are formed in a stepwise manner in the wiring areas for a non-volatile semiconductor storage device of the comparative example.

Comparing the comparative example with the first embodiment, each wiring area Ar1 of the first embodiment may occupy a smaller area than in the comparative example, due to the end shape of the dummy first to fourth word-line conductive layers 72a to 72d. Thus, the second CMP dummy layer 70 of the non-volatile semiconductor storage device 100 according to the first embodiment may occupy a smaller area than in the comparative example. That is, the occupation area of the non-volatile semiconductor storage device 100 according to the first embodiment may be made smaller than in the comparative example. In addition, the second CMP dummy layer 70 may achieve an improved degree of freedom in pattern arrangement than in the comparative example.

Second Embodiment

Figure 18:
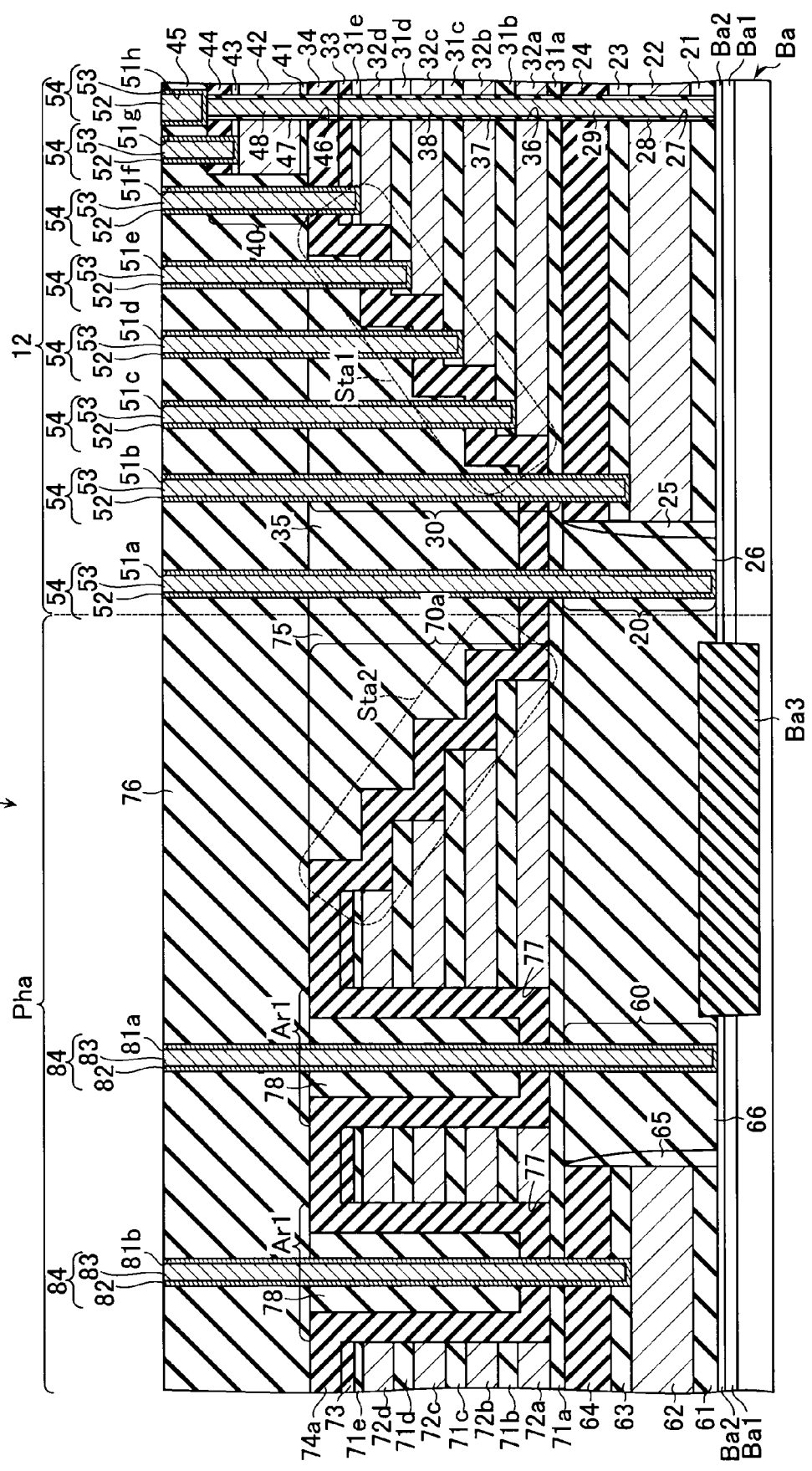
FIG. 18 is a cross-sectional view of a non-volatile semiconductor storage device 100a according to a second embodiment.

Specific Configuration of Non-Volatile Semiconductor Storage Device 100a in Second Embodiment Referring now to FIG. 18, a specific configuration of a non-volatile semiconductor storage device 100a according to a second embodiment will be described below. FIG. 18 is a cross-sectional view in the row direction of the non-volatile semiconductor storage device 100a according to the second embodiment. Note that the same reference numerals represent the same components as the first embodiment and description thereof will be omitted in the second embodiment.

As illustrated in FIG. 18, the non-volatile semiconductor storage device 100a has a peripheral area Pha different from the first embodiment. The peripheral area Pha has a second CMP dummy layer 70a different from the first embodiment.

The second CMP dummy layer 70a has a dummy memory protection insulation layer 74a different from the first embodiment. Unlike the first embodiment, the dummy memory protection insulation layer 74a is continuously formed over the respective sidewalls, facing the holes 77, of the dummy first to fifth inter-wordline insulation layers 71a to 71e, the dummy first to fourth word-line conductive layers 72a to 72d, and the dummy memory isolation/insulation layer 73, as well as the bottom portions of the holes 77. That is, the wiring areas Ar1 are formed to be filled up with the connecting conductive layers 84, the in-hole insulation layers 78, and the dummy memory protection insulation layer 74a.

Manufacturing Process of Non-Volatile Semiconductor Storage Device 100a in Second Embodiment Referring now to FIGS. 19 to 24, the manufacturing process of the non-volatile semiconductor storage device 10a according to the second embodiment will be described below.

Figure 19:
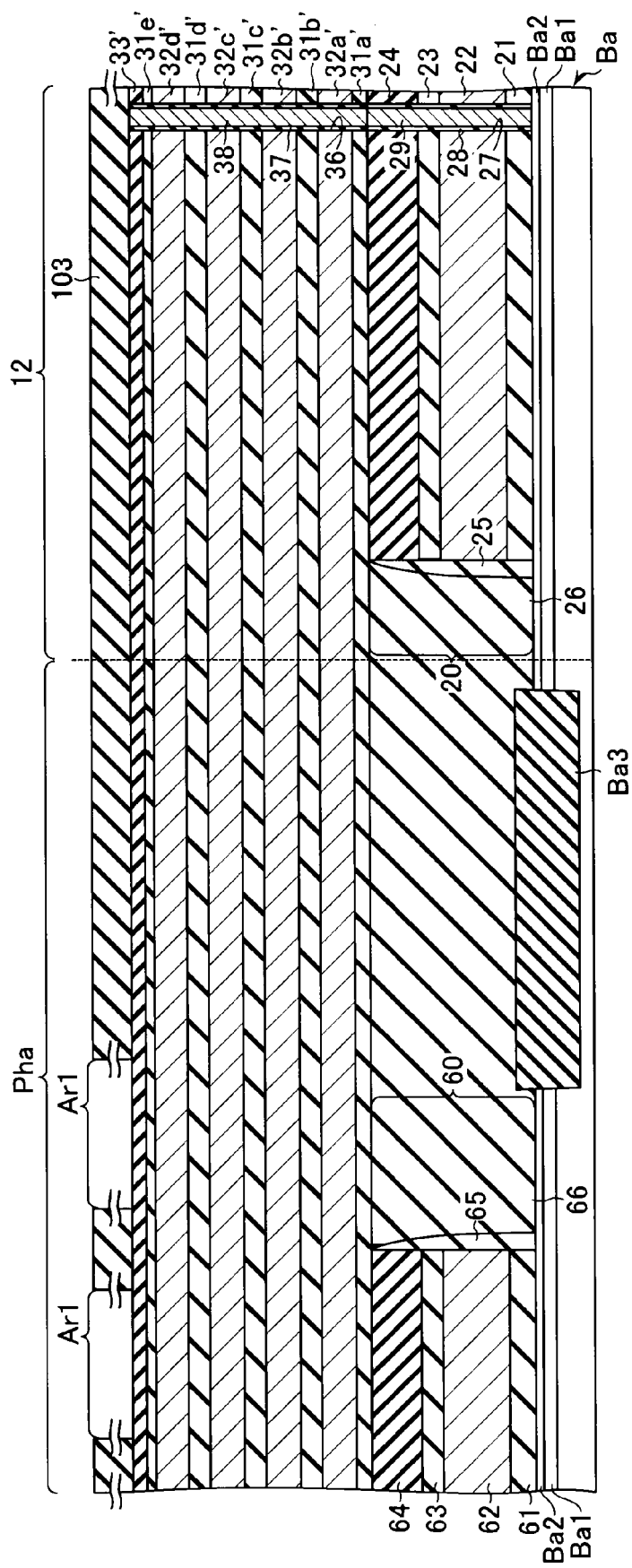
FIG. 19 is a cross-sectional view of the non-volatile semiconductor storage device 100a in a manufacturing process according to the second embodiment.

Firstly, those steps are performed as illustrated in FIGS. 1 to 6 in the first embodiment. Then, a resist 103 is formed as illustrated in FIG. 19. The resist 103 is formed on the plate-like isolation/insulation layer 33', excluding those areas for the wiring areas Ar1.

Figure 20:
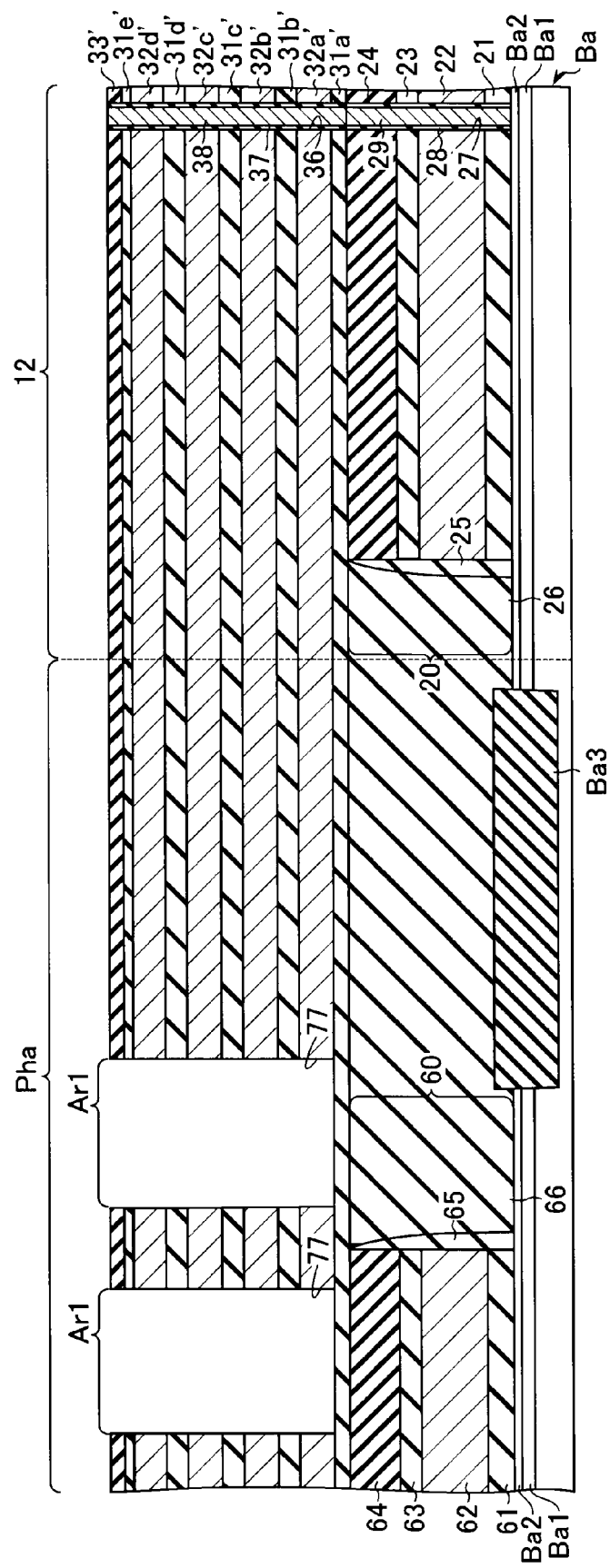
FIG. 20 is a cross-sectional view of the non-volatile semiconductor storage device 100a in the manufacturing process according to the second embodiment.

Then, as illustrated in FIG. 20, etching is performed using the resist 103 as a mask. Note that the resist 103 is removed after the etching. Through the process illustrated in FIG. 20, holes 77 are formed.

Figure 21:
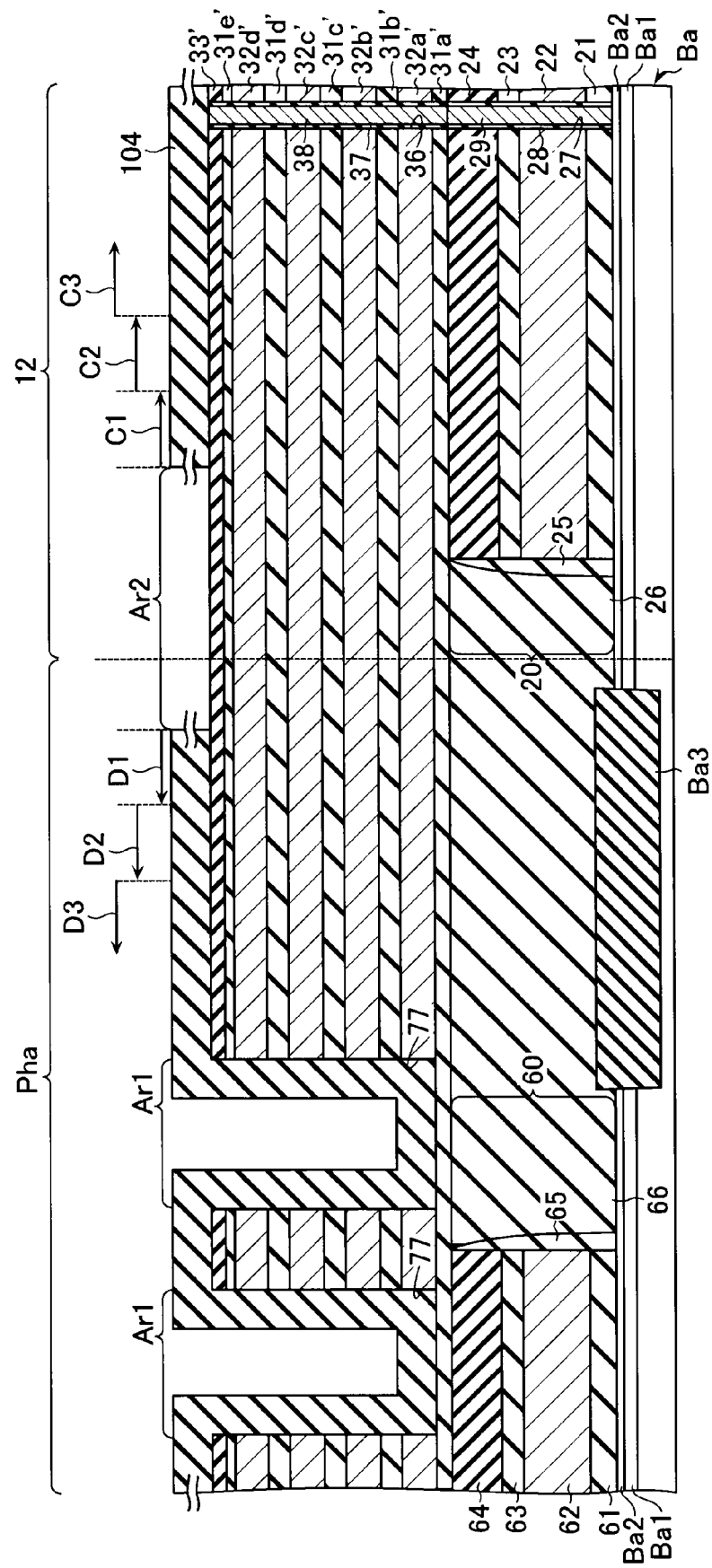
FIG. 21 is a cross-sectional view of the non-volatile semiconductor storage device 100a in the manufacturing process according to the second embodiment.

Then, as illustrated in FIG. 21, a resist 104 is formed on the plate-like isolation/insulation layer 33', excluding the area Ar2 that corresponds to the boundary between the memory transistor area 12 and the peripheral area Ph. In this case, for example, the resist 104 is formed with a thickness of about 3 μm. The resist 104 is used as a mask for etching. Then, etching is performed using the resist 104 as a mask, while slimming down the resist 104 in the directions indicated by the arrows C1 to C3 and D1 to D3, respectively. Note that the resist 104 is removed after the etching.

Figure 22:
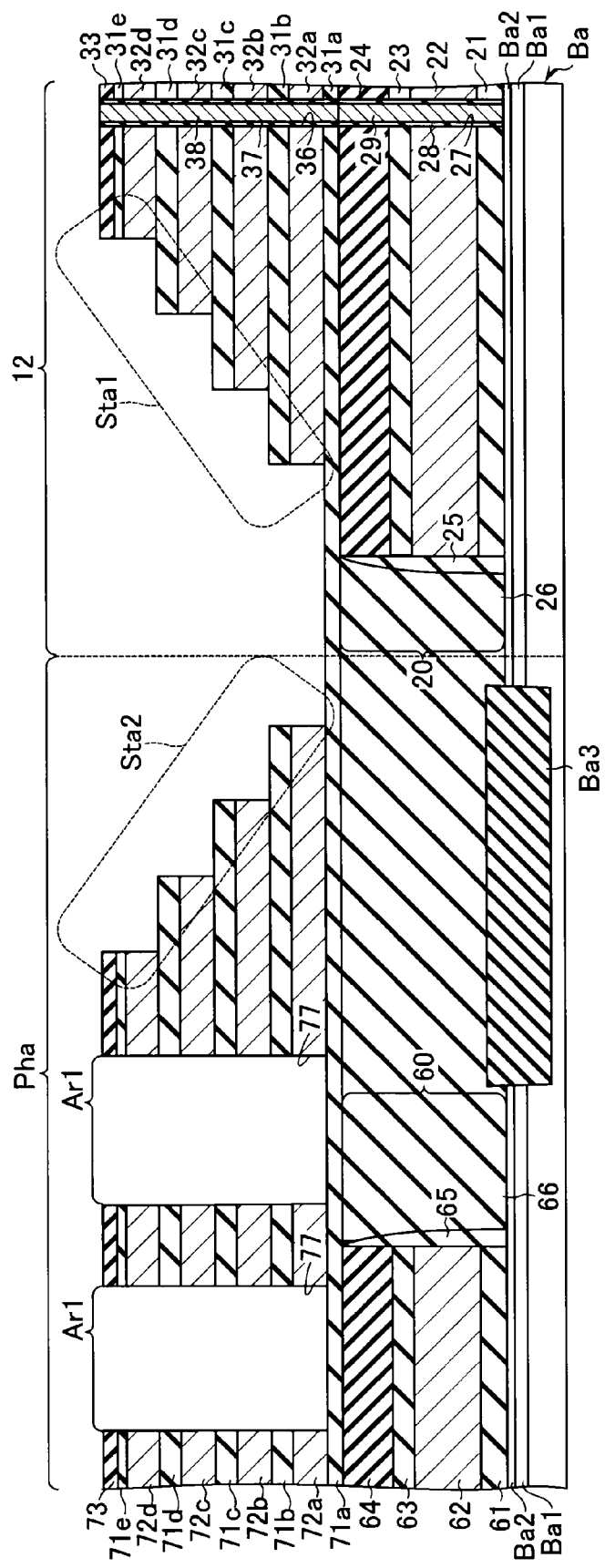
FIG. 22 is a cross-sectional view of the non-volatile semiconductor storage device 100a in the manufacturing process according to the second embodiment.

Through the process illustrated in FIG. 21, the lamination structure is formed as illustrated in FIG. 22. That is, the first to fifth plate-like insulation layers 31a' to 31e' become the first to fifth inter-wordline insulation layers 31a to 31e. The first to fourth plate-like conductive layers 32a' to 32d' become the first to fourth word-line conductive layers 32a to 32d. The plate-like isolation/insulation layer 33' becomes the memory isolation/insulation layer 33. In addition, through the process illustrated in FIG. 21, the first to fifth inter-wordline insulation layers 31a to 31e, the first to fourth word-line conductive layers 32a to 32d, as well as the memory isolation/insulation layer 33 are formed in a stepwise manner in relation to each other at their row-direction ends (as indicated by "Sta1" in FIG. 22).

Similarly, the first to fifth plate-like insulation layers 31a' to 31e' become the dummy first to fifth inter-wordline insulation layers 71a to 71e. The first to fourth plate-like conductive layers 32a' to 32d' become the dummy first to fourth word-line conductive layers 72a to 72d. The plate-like isolation/insulation layer 33' becomes the dummy memory isolation/insulation layer 73. In addition, through the process illustrated in FIG. 21, the dummy first to fifth inter-wordline insulation layers 71a to 71e, the dummy first to fourth word-line conductive layers 72a to 72d, as well as the dummy memory isolation/insulation layer 73 are formed in a stepwise manner in relation to each other at their row-direction ends on the memory transistor layer 30 side (as indicated by "Sta2" in FIG. 22).

Figure 23:
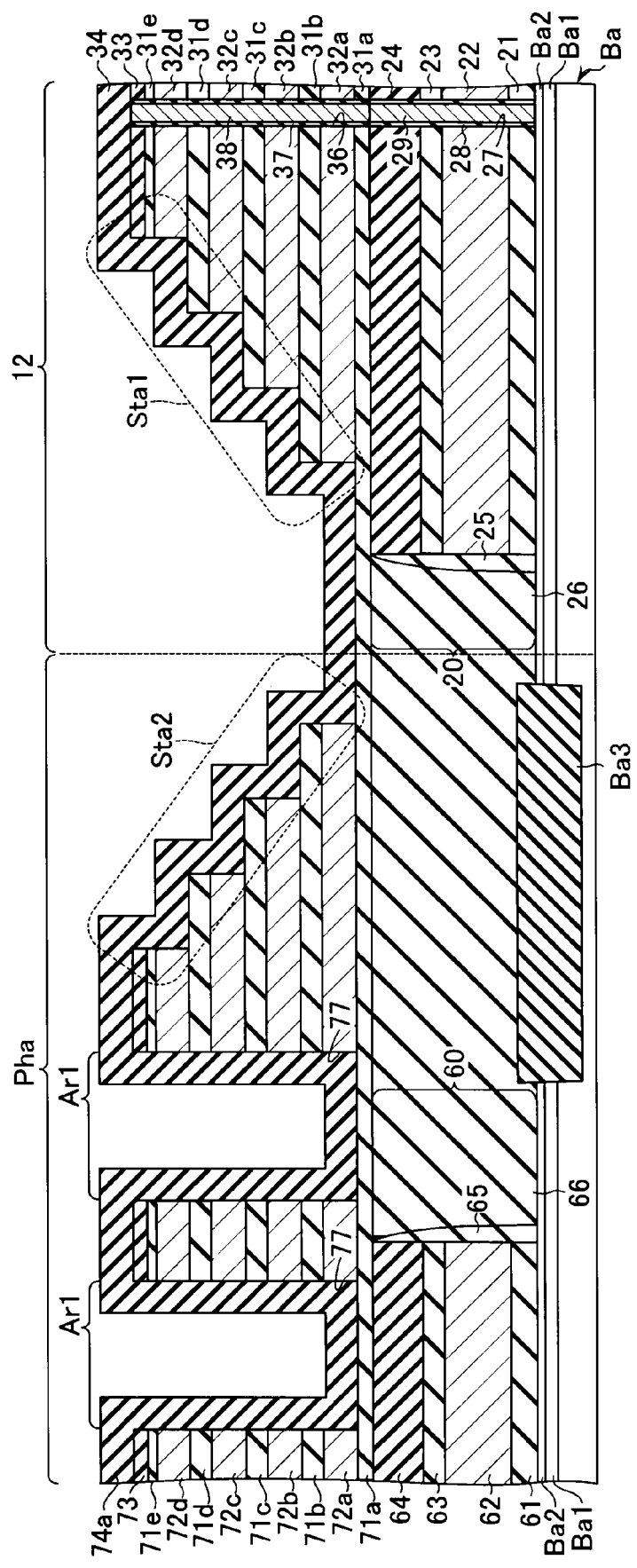
FIG. 23 is a cross-sectional view of the non-volatile semiconductor storage device 10a in the manufacturing process according to the second embodiment.

Then, silicon nitride (SiN) is deposited as illustrated in FIG. 23 to form a memory protection insulation layer 34 and a dummy memory protection insulation layer 74a. Note that the memory protection insulation layer 34 and the dummy memory protection insulation layer 74a are integrally formed with each other. In this case, the dummy memory protection insulation layer 74a is continuously formed over the respective sidewalls, facing the holes 77, of the dummy first to fifth inter-wordline insulation layers 71a to 71e, the dummy first to fourth word-line conductive layers 72a to 72d, and the dummy memory isolation/insulation layer 73, as well as the bottom portions of the holes 77.

Figure 24:
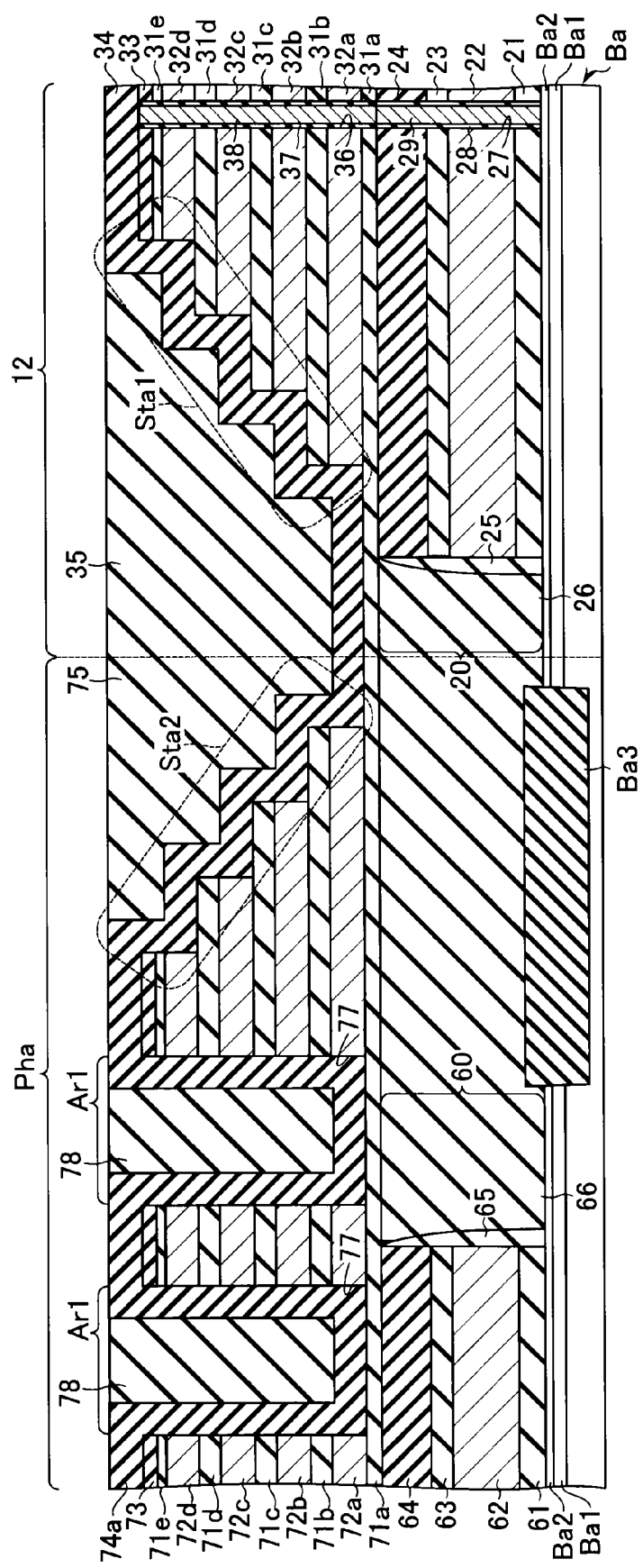
FIG. 24 is a cross-sectional view of the non-volatile semiconductor storage device 100a in the manufacturing process according to the second embodiment.

Then, silicon oxide (SiO₂) is deposited as illustrated in FIG. 24 and CMP is performed to form interlayer insulation layers 35, 75, and in-hole insulation layers 78. In the step of FIG. 24, the memory protection insulation layer 34 functions as a stopper for CMP. Similarly, the dummy memory protection insulation layer 74a functions as a stopper that is used for making the polished surface of the memory transistor layer 30 parallel to a desired surface in flattening the memory transistor layer 30 by CMP.

In the step of FIG. 24, the interlayer insulation layer 35 is formed ranging from the top surface of the memory protection insulation layer 34 on the first inter-wordline insulation layer 31a to the top surface of the memory protection insulation layer 34 on the memory isolation/insulation layer 33. In addition, the interlayer insulation layer 75 is formed ranging from the top surface of the dummy memory protection insulation layer 74a on the dummy first inter-wordline insulation layer 71a to the top surface of the dummy memory protection insulation layer 74a on the dummy memory isolation/insulation layer 73. Further, the in-hole insulation layers 78 are formed to fill up the holes 77.

Following the step of FIG. 24, those steps are performed as illustrated in FIGS. 13 to 17 in the first embodiment, thereby forming the non-volatile semiconductor storage device 100a according to the second embodiment.

The manufacturing process of the memory protection insulation layer 34 and the dummy memory protection insulation layer 74a according to the second embodiment can be restated as follows: in the second embodiment, the memory protection insulation layer 34 and the dummy memory protection insulation layer 74a are continuously formed over the first to fourth plate-like conductive layers 32a' to 32d', after the holes 77 are formed and the first to fourth plate-like conductive layers 32a' to 32d' are processed in a stepwise manner in relation to each other, and before the in-hole insulation layers 78 are formed in the holes 77.

Advantages of Non-Volatile Semiconductor Storage Device 100a in Second Embodiment Advantages of the non-volatile semiconductor storage device 100a according to the second embodiment will now be described below. The non-volatile semiconductor storage device 100a according to the second embodiment has substantially the same configuration as the first embodiment. Accordingly, the non-volatile semiconductor storage device 100a according to the second embodiment provides similar advantages to those in the first embodiment.

Third Embodiment

Figure 25:
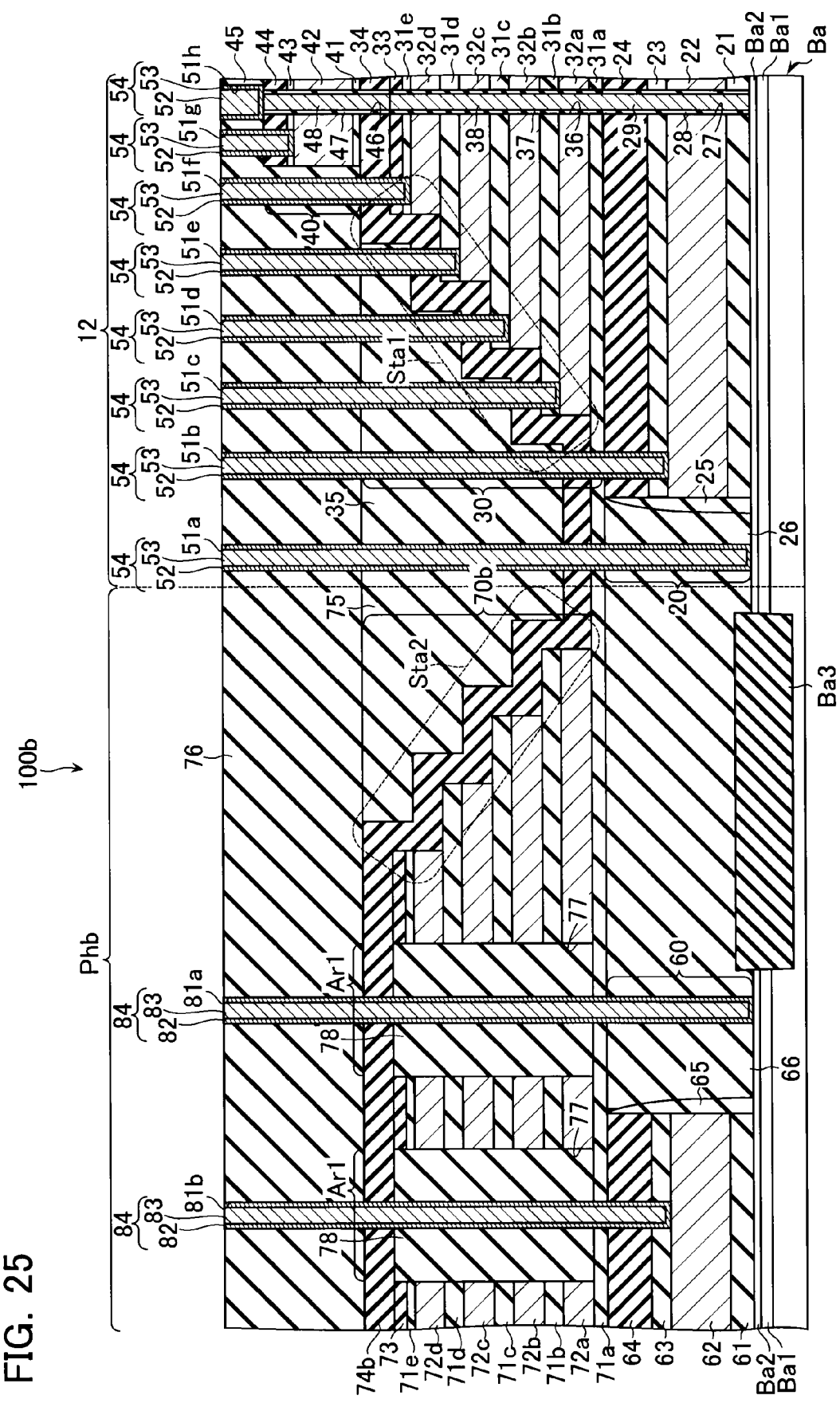
FIG. 25 is a cross-sectional view of a non-volatile semiconductor storage device 100b according to a third embodiment.

Specific Configuration of Non-Volatile Semiconductor Storage Device 100b in Third Embodiment Referring now to FIG. 25, a specific configuration of a non-volatile semiconductor storage device 100b according to a third embodiment will be described below. FIG. 25 is a cross-sectional view in the row direction of the non-volatile semiconductor storage device 100b according to the third embodiment. Note that the same reference numerals represent the same components as the first and second embodiments and description thereof will be omitted in the third embodiment.

As illustrated in FIG. 25, the non-volatile semiconductor storage device 100b has a peripheral area Phb different from the first and second embodiments. The peripheral area Phb has a second CMP dummy layer 70b different from the first and second embodiments.

The second CMP dummy layer 70b has a dummy memory protection insulation layer 74b different from the first and second embodiments. Unlike the first and second embodiments, the dummy memory protection insulation layer 74b is continuously formed over the top surfaces of the in-hole insulation layers 78 formed in the holes 77. Note that, as in the first embodiment, the wiring areas Ar1 are formed to be filled up with the connecting conductive layers 84 and the in-hole insulation layers 78.

Manufacturing Process of Non-Volatile Semiconductor Storage Device 100b in Third Embodiment Referring now to FIGS. 26 to 30, the manufacturing process of the non-volatile semiconductor storage device 100b according to the third embodiment will be described below.

Figure 26:
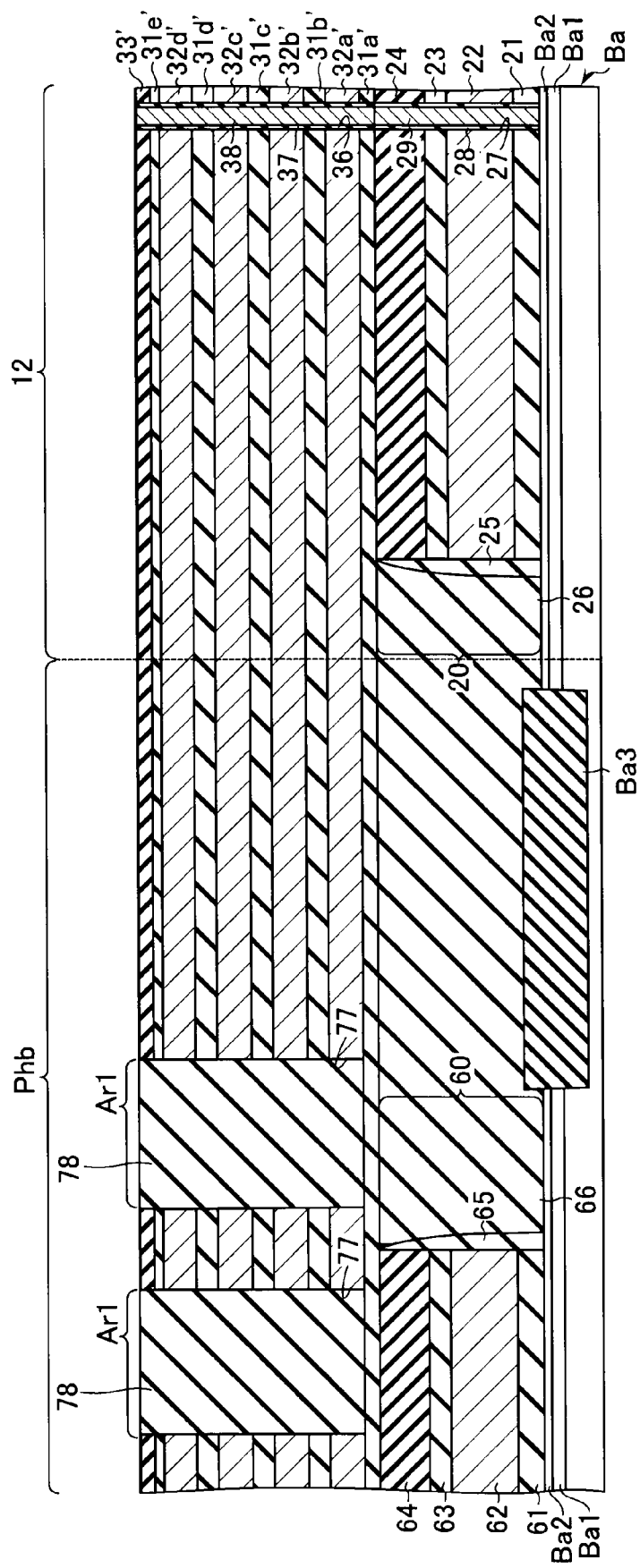
FIG. 26 is a cross-sectional view of the non-volatile semiconductor storage device 100b in a manufacturing process according to the third embodiment.

Firstly, those steps are performed as illustrated in FIG. 20 in the second embodiment. Then, silicon oxide (SiO$_2$) is deposited as illustrated in FIG. 26 to form in-hole insulation layers 78 within the holes 77.

Figure 27:
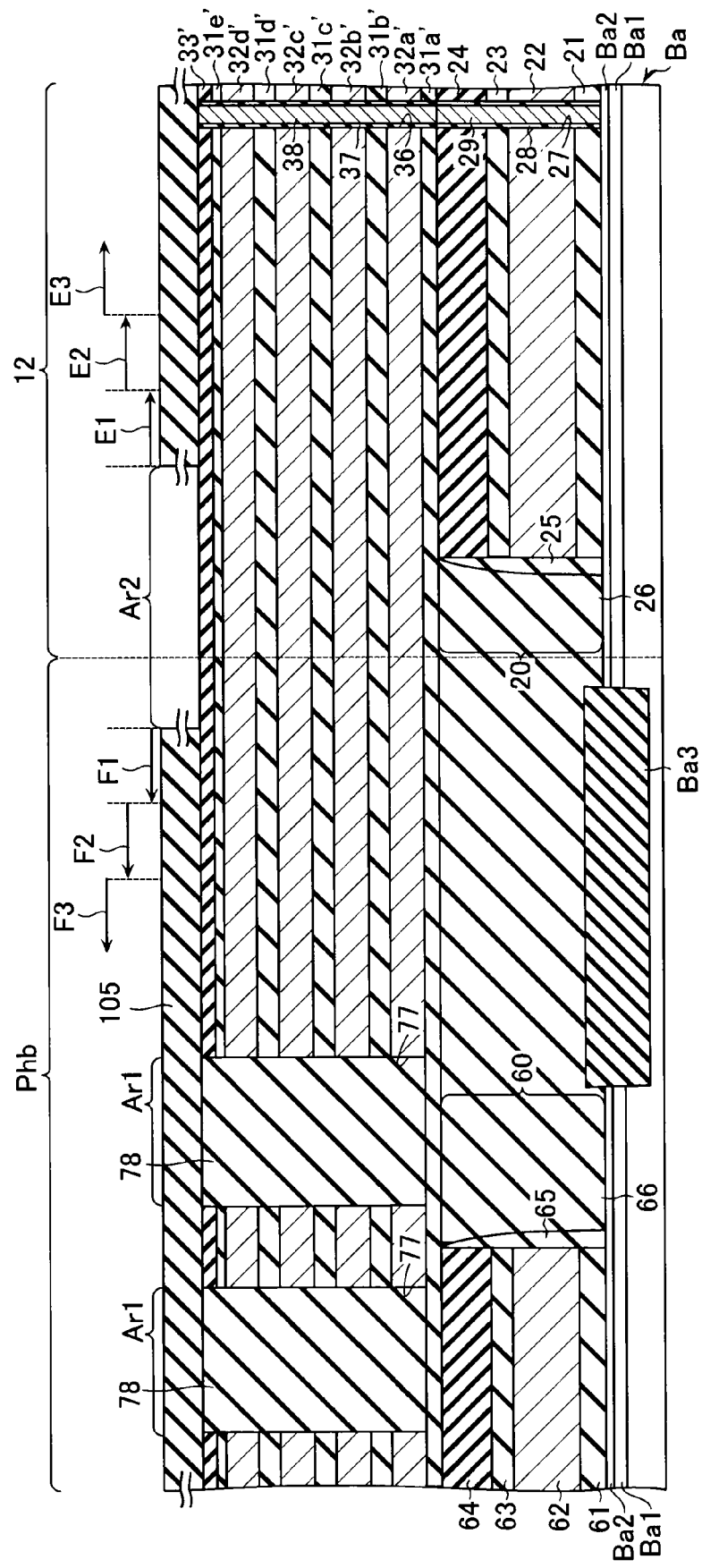
FIG. 27 is a cross-sectional view of the non-volatile semiconductor storage device 100b in the manufacturing process according to the third embodiment.

Then, as illustrated in FIG. 27, a resist 105 is formed on the plate-like isolation/insulation layer 33' and the in-hole insulation layers 78, excluding the area Ar2 that corresponds to the boundary between the memory transistor area 12 and the peripheral area Ph. In this case, for example, the resist 105 is formed with a thickness of about 3 μm. The resist 105 is used as a mask for etching. Then, etching is performed using the resist 105 as a mask, while slimming down the resist 105 in the directions indicated by the arrows E1 to E3 and F1 to F3, respectively. Note that the resist 105 is removed after the etching.

Figure 28:
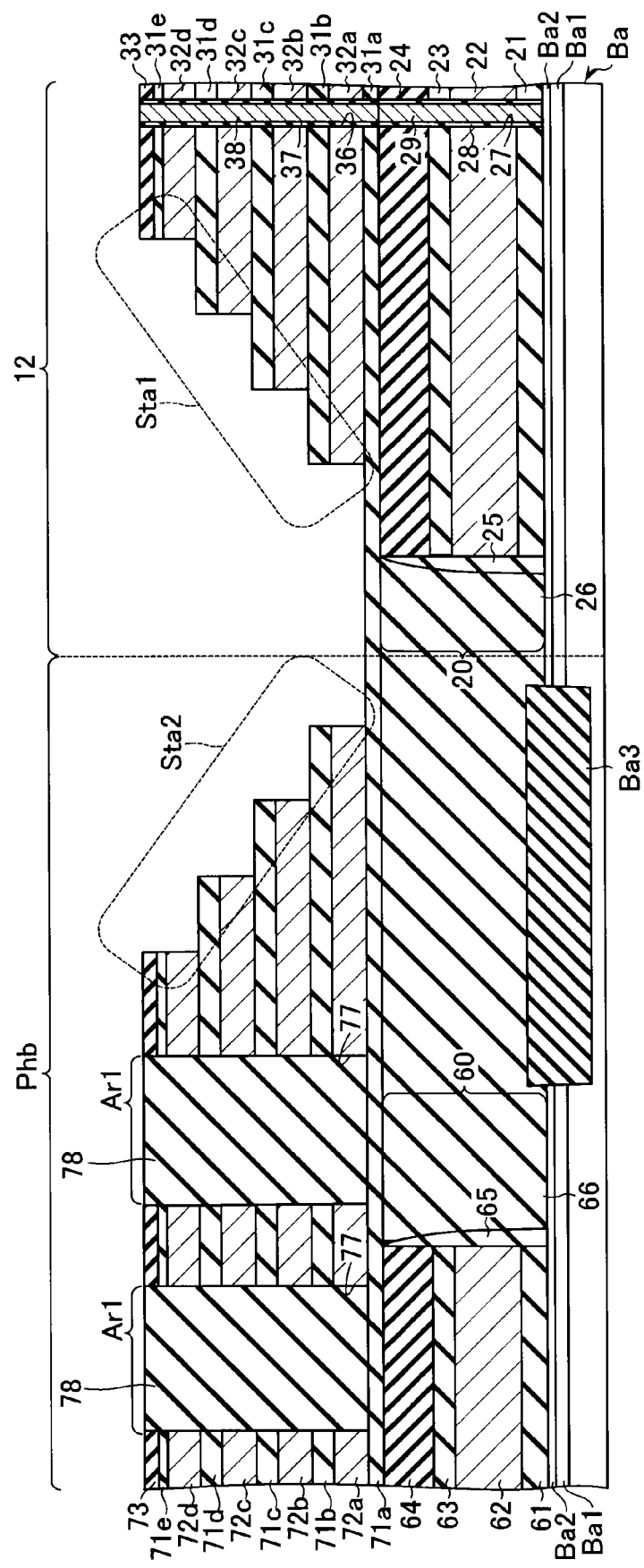
FIG. 28 is a cross-sectional view of the non-volatile semiconductor storage device 100b in the manufacturing process according to the third embodiment.

Through the process illustrated in FIG. 27, the lamination structure is formed as illustrated in FIG. 28. That is, the first to fifth plate-like insulation layers 31a' to 31e' become the first to fifth inter-wordline insulation layers 31a to 31e. The first to fourth plate-like conductive layers 32a' to 32d' become the first to fourth word-line conductive layers 32a to 32d. The plate-like isolation/insulation layer 33' becomes the memory isolation/insulation layer 33. In addition, through the process of FIG. 27, the first to fifth inter-wordline insulation layers 31a to 31e, the first to fourth word-line conductive layers 32a to 32d, as well as the memory isolation/insulation layer 33 are formed in a stepwise manner in relation to each other at their row-direction ends (as indicated by "Sta1" in FIG. 28).

Similarly, through the process of FIG. 27, the first to fifth plate-like insulation layers 31a' to 31e' become the dummy first to fifth inter-wordline insulation layers 71a to 71e. The first to fourth plate-like conductive layers 32a' to 32d' become the dummy first to fourth word-line conductive layers 72a to 72d. The plate-like isolation/insulation layer 33' becomes the dummy memory isolation/insulation layer 73. In addition, through the process of FIG. 27, the dummy first to fifth inter-wordline insulation layers 71a to 71e, the dummy first to fourth word-line conductive layers 72a to 72d, as well as the dummy memory isolation/insulation layer 73 are formed in a stepwise manner at their row-direction ends on the memory transistor layer 30 side (as indicated by "Sta2" in FIG. 28).

Figure 29:
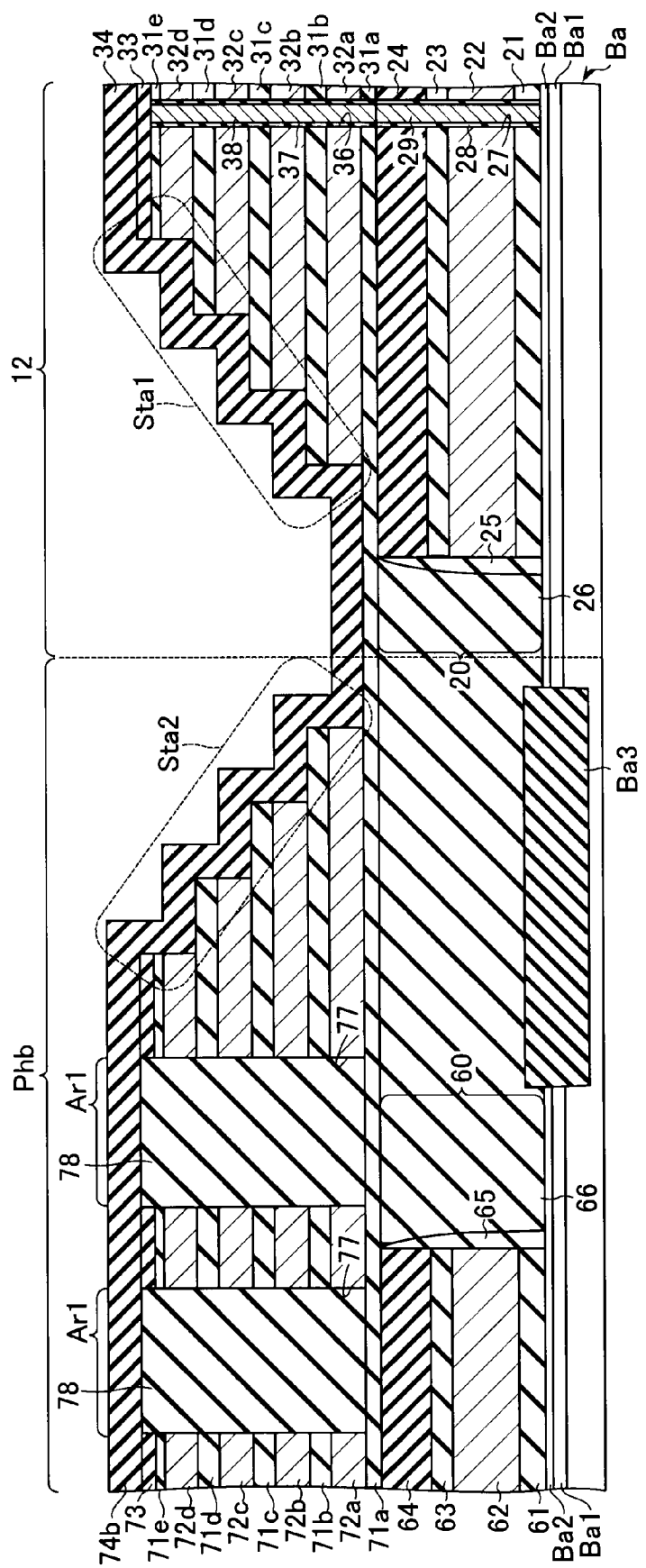
FIG. 29 is a cross-sectional view of the non-volatile semiconductor storage device 100b in the manufacturing process according to the third embodiment.

Then, silicon nitride (SiN) is deposited as illustrated in FIG. 29 to form a memory protection insulation layer 34 and a dummy memory protection insulation layer 74b. Note that the memory protection insulation layer 34 and the dummy memory protection insulation layer 74b are integrally formed with each other. The dummy memory protection insulation layer 74b is formed over the top surfaces of the in-hole insulation layers 78 formed in the holes 77.

Figure 30:
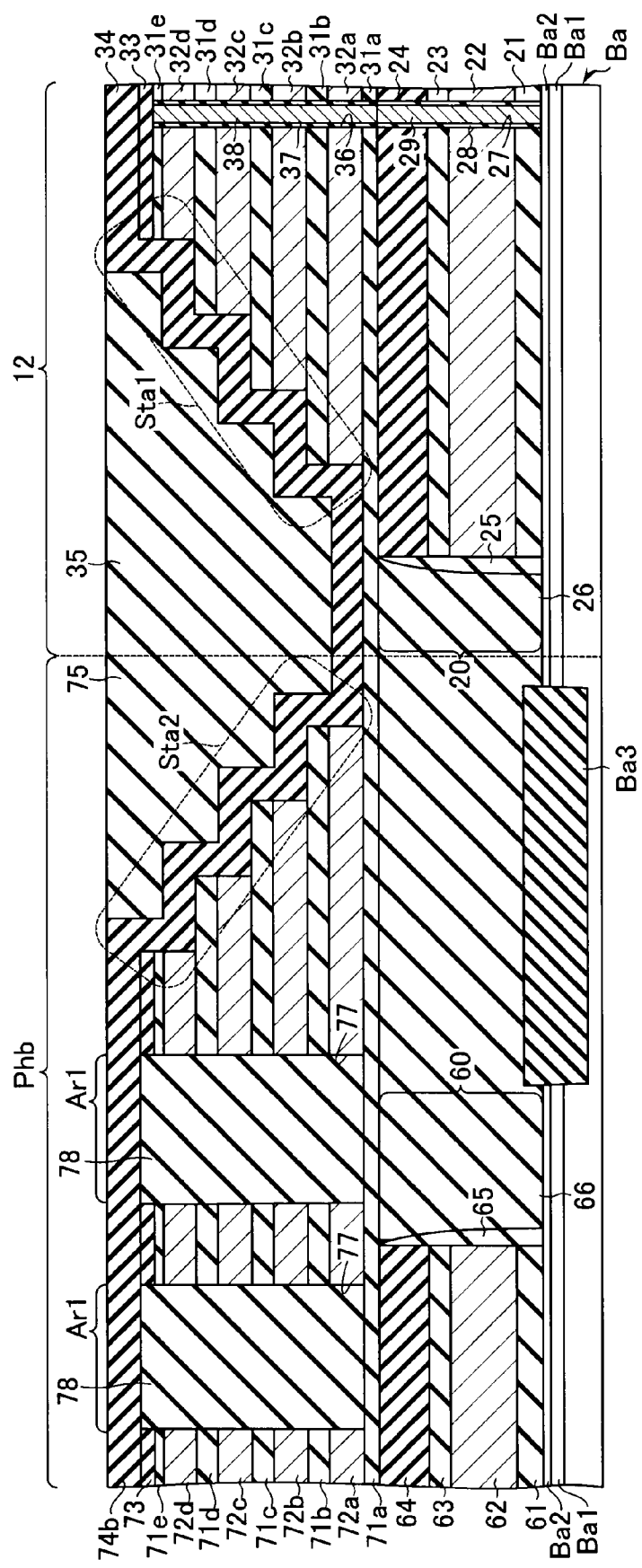
FIG. 30 is a cross-sectional view of the non-volatile semiconductor storage device 100b in the manufacturing process according to the third embodiment.

Then, silicon oxide (SiO$_2$) is deposited as illustrated in FIG. 30 and CMP is performed to form interlayer insulation layers 35 and 75. In the step of FIG. 30, the memory protection insulation layer 34 functions as a stopper for CMP. Similarly, the dummy memory protection insulation layer 74b functions as a stopper that is used for making the polished surface of the memory transistor layer 30 parallel to a desired surface in flattening the memory transistor layer 30 by CMP.

Following the step of FIG. 30, those steps are performed as illustrated in FIGS. 13 to 17 in the first embodiment, thereby forming the non-volatile semiconductor storage device 100b according to the third embodiment.

The manufacturing process of the memory protection insulation layer 34 and the dummy memory protection insulation layer 74b according to the third embodiment can be restated as follows: in the third embodiment, the memory protection insulation layer 34 and the dummy memory protection insulation layer 74b are continuously formed over the first to fourth plate-like conductive layers 32a' to 32d', after the in-hole insulation layers 78 are formed in the holes 77 and the first to fourth plate-like conductive layers 32a' to 32d' are processed in a stepwise manner in relation to each other.

Advantages of Non-Volatile Semiconductor Storage Device 100b in Third Embodiment Advantages of the non-volatile semiconductor storage device 100b according to the third embodiment will now be described below. The non-volatile semiconductor storage device 100b according to the third embodiment has substantially the same configuration as the first and second embodiments. Accordingly, the non-volatile semiconductor storage device 100b according to the third embodiment provides similar advantages to those in the first and second embodiments.

Fourth Embodiment

Figure 31:
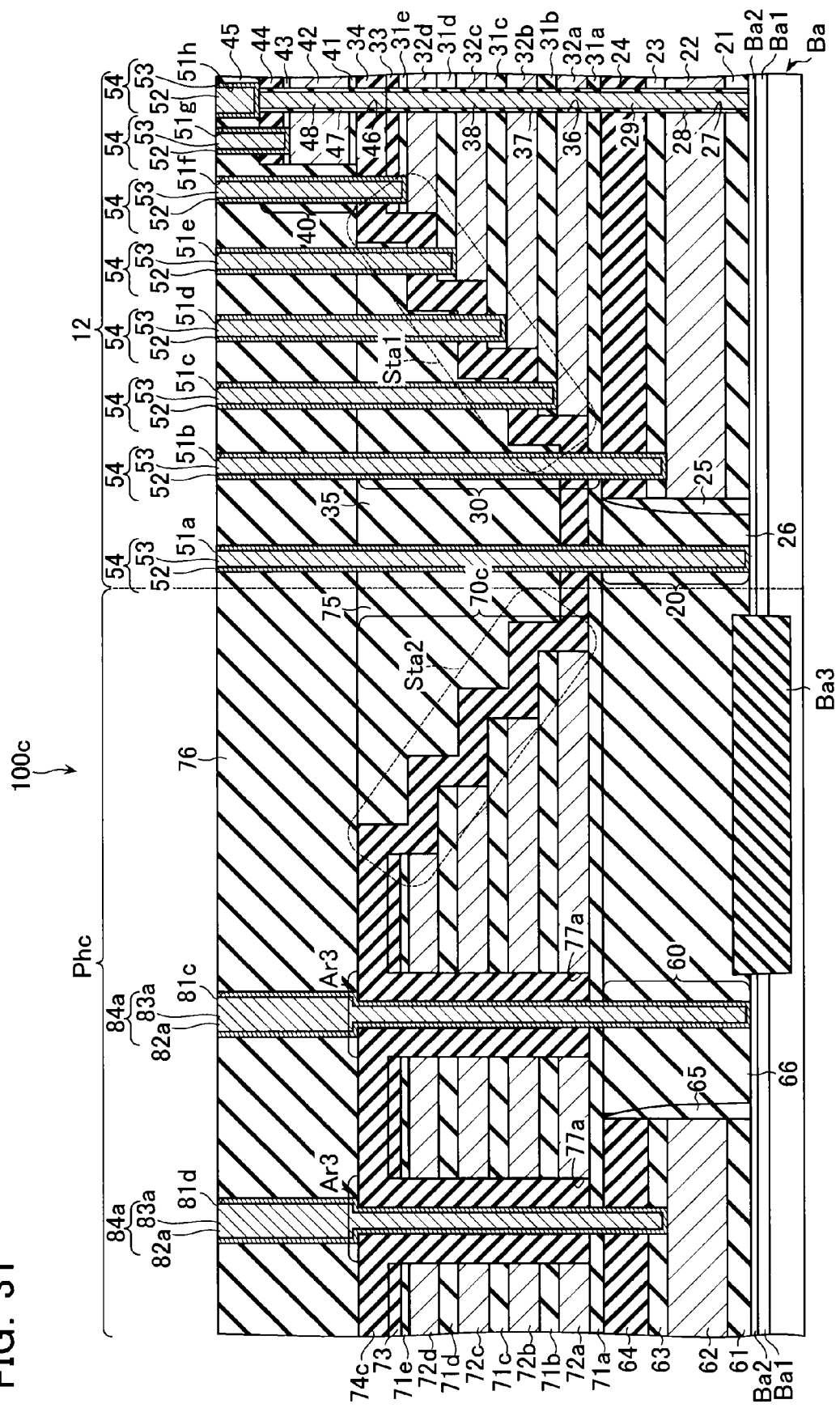
FIG. 31 is a cross-sectional view of a non-volatile semiconductor storage device 100c according to a fourth embodiment.

Specific Configuration of Non-Volatile Semiconductor Storage Device 100c in Fourth Embodiment Referring now to FIG. 31, a specific configuration of a non-volatile semiconductor storage device 100c according to a fourth embodiment will be described below. FIG. 31 is a cross-sectional view in the row direction of the non-volatile semiconductor storage device 100c according to the fourth embodiment. Note that the same reference numerals represent the same components as the first to third embodiments and description thereof will be omitted in the fourth embodiment.

As illustrated in FIG. 31, the non-volatile semiconductor storage device 100c has a peripheral area Phc different from the first to third embodiments. The peripheral area Phc has a second CMP dummy layer 70c different from the first to third embodiments.

The second CMP dummy layer 70c has holes 77a and a dummy memory protection insulation layer 74c, each of which is different from the first to third embodiments. In addition, the first CMP dummy layer 60 and the second CMP dummy layer 70c have contact holes 81c and 81d as well as connecting conductive layers 84a formed therein, each of which is also different from the first to third embodiments.

The holes 77a are formed with a radius smaller than that in the first to third embodiments. Unlike the first to third embodiments, in-hole insulation layers 78 are not formed in the holes 77a.

As in the second embodiment, the dummy memory protection insulation layer 74c is continuously formed on the respective sidewalls, facing the holes 77a, of the dummy first to fifth inter-wordline insulation layers 71a to 71e, the dummy first to fourth word-line conductive layers 72a to 72d, as well as the dummy memory isolation/insulation layer 73.

The contact holes 81c and 81d are formed along the side surfaces of the dummy memory protection insulation layer 74c from the second CMP dummy layer 70c down. The connecting conductive layers 84a are formed in the contact holes 81c and 81d different from the first to third embodiments. That is, the contact holes 81c and 81d as well as the connecting conductive layers 84a (barrier metal layers 82a and metal layers 83a) are formed with a radius smaller than that in the first to third embodiments from the second CMP dummy layer 70c down.

The above configuration is restated as follows: the wiring areas Ar3 in which the connecting conductive layers 84a are provided are configured to be filled up with the connecting conductive layers 84a and the dummy memory protection insulation layer 74c.

Manufacturing Process of Non-Volatile Semiconductor Storage Device 100c in Fourth Embodiment Referring now to FIGS. 32 and 33, the manufacturing process of the non-volatile semiconductor storage device 100c according to the fourth embodiment will be described below.

Figure 32:
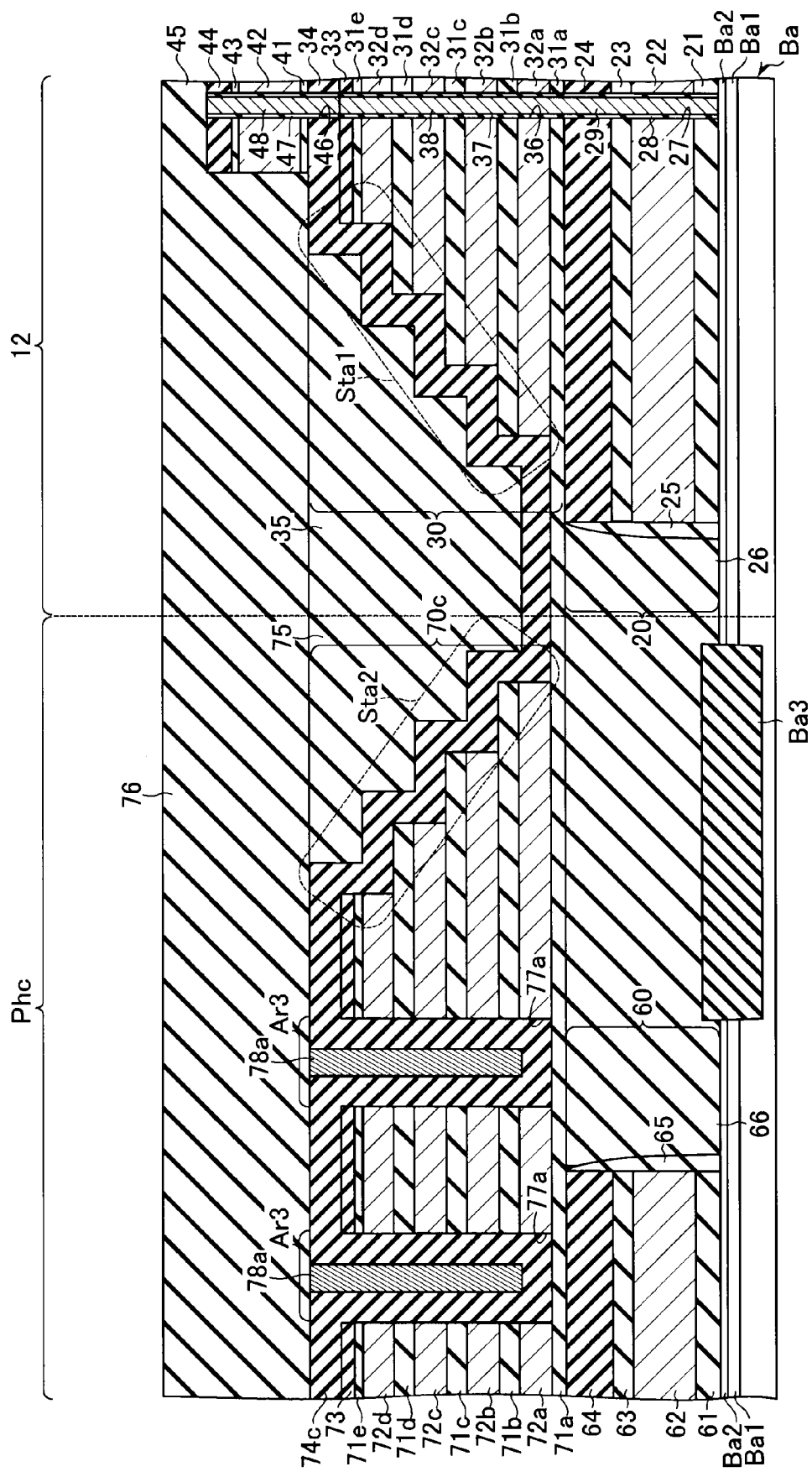
FIG. 32 is a cross-sectional view of the non-volatile semiconductor storage device 100c in a manufacturing process according to the fourth embodiment.

Firstly, interlayer insulation layers 45 and 76 are formed through those steps as described in the second embodiment and the lamination structure is formed as illustrated in FIG. 32. However, the wiring areas Ar3 in the fourth embodiment are formed with a radius smaller than that of the wiring areas Ar1 in the second embodiment. That is, in the fourth embodiment, holes 77a are formed with a radius smaller than the second embodiment. In addition, sacrifice layers 78a are formed in the holes 77a. The sacrifice layers 78a are composed of, for example, material with a higher etching rate than silicon oxide ($SiO_2$).

Figure 33:
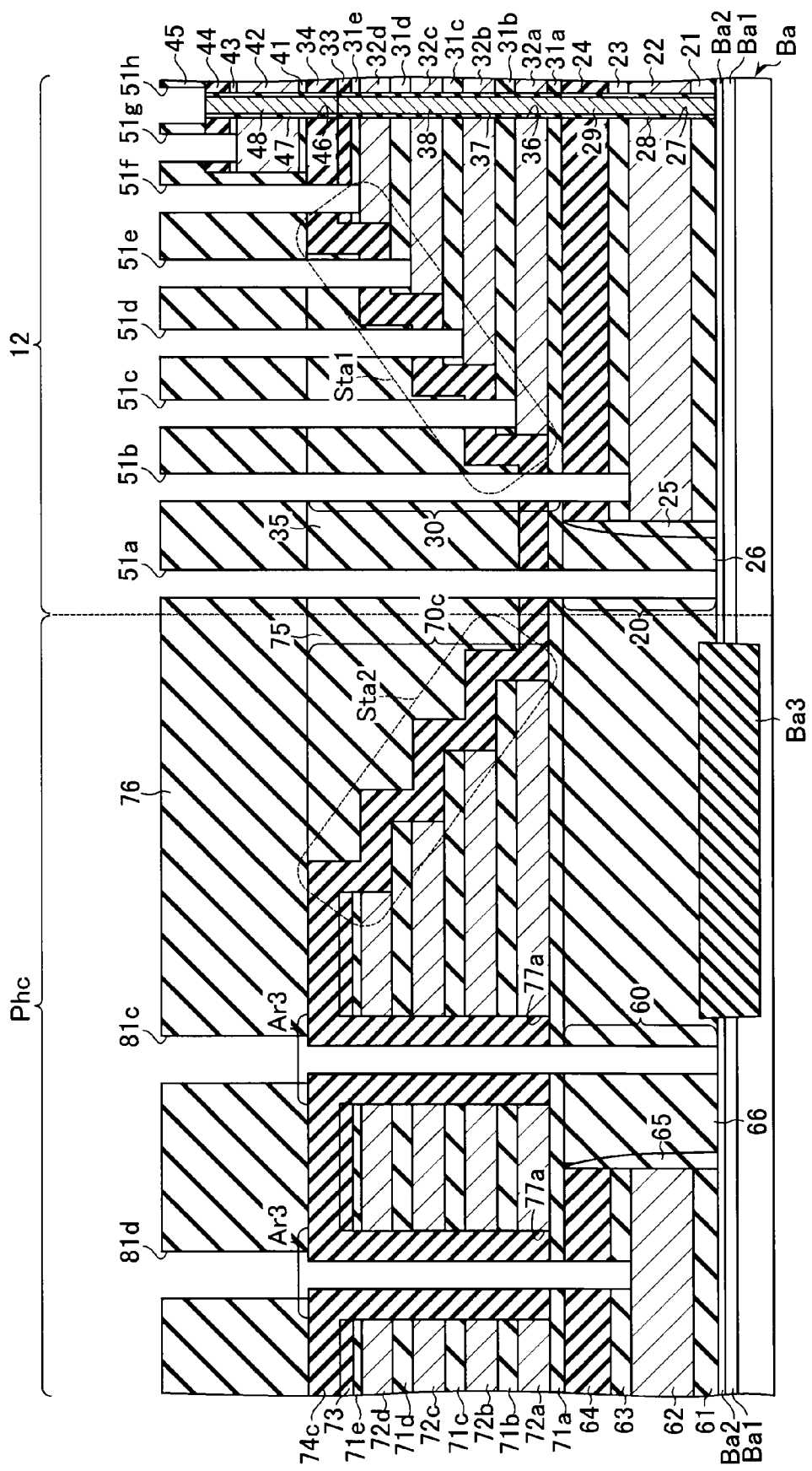
FIG. 33 is a cross-sectional view of the non-volatile semiconductor storage device 100c in the manufacturing process according to the fourth embodiment.

Then, as illustrated in FIG. 33, contact holes 51a to 51h are formed in the memory transistor area 12. In addition, contact holes 81c and 81d are formed in the peripheral area Phc. In forming the contact holes 81c and 81d, a dummy memory protection insulation layer 74c functions as a mask that is used for etching the sacrifice layers 78a.

The manufacturing process of the memory protection insulation layer 34 and the dummy memory protection insulation layer 74c according to the fourth embodiment can be restated as follows: in the fourth embodiment, the memory protection insulation layer 34 and the dummy memory protection insulation layer 74c are continuously formed over the first to fourth plate-like conductive layers 32a' to 32d', after the holes 77 are formed and the first to fourth plate-like conductive layers 32a' to 32d' are processed in a stepwise manner in relation to each other, and before the sacrifice layers 78a are formed in the holes 77, as in the second embodiment.

Advantages of Non-Volatile Semiconductor Storage 100c Device in Fourth Embodiment Advantages of the non-volatile semiconductor storage device 100c according to the fourth embodiment will now be described below. The non-volatile semiconductor storage device 100c according to the fourth embodiment has substantially the same configuration as the first to third embodiments. Accordingly, the non-volatile semiconductor storage device 100c according to the fourth embodiment provides similar advantages to those in the first to third embodiments.

Further, in the non-volatile semiconductor storage device 100c according to the fourth embodiment, each wiring area Ar3 occupies a smaller area than in the first to third embodiments. Thus, the second CMP dummy layer 70c of the non-volatile semiconductor storage device 100c according to the fourth embodiment may occupy a smaller area than in the first to third embodiments. That is, the occupation area of the non-volatile semiconductor storage device 100c according to the fourth embodiment may be made smaller than the first to third embodiments. In addition, the second CMP dummy layer 70c may achieve an improved degree of freedom in pattern arrangement than in the first to third embodiments.

Other Embodiments

While embodiments of the non-volatile semiconductor storage device have been described, the present invention is not intended to be limited to the disclosed embodiments and various other changes, additions, replacements or the like may be made thereto without departing from the spirit of the invention.

What is claimed is:

1. A non-volatile semiconductor storage device comprising:
   a first layer provided on a substrate, and functioning as a plurality of electrically rewritable memory cells connected in series; and
   a second layer provided on the substrate around the first layer, and separately-placed from the first layer along a direction parallel to the substrate,
   the first layer comprising:
      a plurality of first conductive layers extending parallel to a substrate and laminated in a direction perpendicular to the substrate, the first conductive layers functioning as control gates of the memory cells;
      a first insulation layer formed on an upper layer of the plurality of first conductive layers;
      a first semiconductor layer formed to penetrate the plurality of first conductive layers; and
      a charge accumulation layer formed between the first conductive layers and the first semiconductor layer and configured to be able to accumulate charges,
   respective ends of the first conductive layers being formed in a stepwise manner in relation to each other in a first direction,
   the second layer comprising:
      a plurality of second conductive layers extending in parallel to the substrate and laminated in a direction perpendicular to the substrate, the second conductive layers being formed in the same layer as the plurality of first conductive layers; and
      a second insulation layer formed on an upper layer of the plurality of second conductive layers, and
   respective ends of the second conductive layers being formed to align along a straight line extending in a direction substantially perpendicular to the substrate at a predetermined area.

2. The non-volatile semiconductor storage device according to claim 1, wherein
   the first insulation layer is continuously formed over the plurality of first conductive layers, and
   the second insulation layer is continuously formed over the plurality of second conductive layers.

3. The non-volatile semiconductor storage device according to claim 1, wherein
   the second layer further comprises:
      a connecting conductive layer extending from an upper layer to a lower layer of the second layer; and
      an interlayer insulation layer surrounding the side surfaces of the connecting conductive layer, and
   the predetermined area is configured to be filled up with the connecting conductive layer and the interlayer insulation layer.

4. The non-volatile semiconductor storage device according to claim 3, wherein
   the second insulation layer is continuously formed on the top surface of the interlayer insulation layer.

5. The non-volatile semiconductor storage device according to claim 1, wherein
   the second layer further comprises:
      a connecting conductive layer extending from an upper layer to a lower layer of the second layer; and
      an interlayer insulation layer surrounding the side surfaces of the connecting conductive layer, the second insulation layer is continuously formed on the side surfaces of respective ends of the plurality of conductive layers, and the predetermined area is configured to be filled up with the connecting conductive layer, the interlayer insulation layer, and the second conductive layers.

6. The non-volatile semiconductor storage device according to claim 1, wherein the second layer further comprises a connecting conductive layer extending from an upper layer to a lower layer of the second layer, the second insulation layer is continuously formed on the side surfaces of respective ends of the plurality of conductive layers, and the predetermined area is configured to be filled up with the connecting conductive layer and the second conductive layers.

7. The non-volatile semiconductor storage device according to claim 1, further comprising a third layer formed on a lower layer of the first layer and functioning as a selection transistor connected to one ends of the memory cells, wherein the third layer comprises:
 a third conductive layer located at a lower layer of the plurality of first conductive layers and extending in parallel to the substrate, the third conductive layer functioning as a control gate of the selection transistor;
 a second semiconductor layer formed to penetrate the third conductive layer and in contact with the bottom surface of the first semiconductor layer; and
 a first gate insulation layer formed between the third conductive layer and the second semiconductor layer.

8. The non-volatile semiconductor storage device according to claim 1, further comprising a fourth layer formed on an upper layer of the first layer and functioning as a selection transistor connected to the other ends of the memory cells, wherein the fourth layer comprises:
 a fourth conductive layer located at an upper layer of the plurality of first conductive layers and extending in parallel to the substrate, the fourth conductive layer functioning as a control gate of the selection transistor;
 a third semiconductor layer formed to penetrate the fourth conductive layer and in contact with the top surface of the first semiconductor layer; and
 a second gate insulation layer formed between the fourth conductive layer and the third semiconductor layer.

9. The non-volatile semiconductor storage device according to claim 1, wherein
 the first insulation layer and the second insulation layer are composed of silicon nitride.

10. The non-volatile semiconductor storage device according to claim 1, further comprising a fifth layer formed on a lower layer of the second layer and functioning as a MOS transistor, wherein the fifth layer comprises:
 a connecting conductive layer extending from the second layer to a lower layer; and
 a fifth conductive layer in contact with the bottom surface of the connecting conductive layer and extending parallel to the substrate, the fifth conductive layer functioning as a control gate of the MOS transistor.

11. The non-volatile semiconductor storage device according to claim 1, wherein those ends of the plurality of second conductive layers adjacent to the first layer in the first direction are formed in a stepwise manner in relation to each other.

12. A method of manufacturing a non-volatile semiconductor storage device including: a first area provided on a substrate, and functioning as a plurality of electrically rewritable memory cells connected in series; and a second area provided on the substrate around the first area, and separately-placed from the first area along a direction parallel to the substrate, the method comprising:

forming a plurality of first conductive layers extending parallel to the substrate so that the first conductive layers are laminated on the substrate over multiple layers;

processing the plurality of first conductive layers in a stepwise manner in relation to each other at respective ends in a first direction in the first area;

forming a first through hole to penetrate the plurality of first conductive layers at a predetermined area in the second area;

forming a first insulation layer in the first through hole;

forming a second through hole to penetrate the first insulation layer; and forming second conductive layers to fill up the second through hole.

13. The method of manufacturing the non-volatile semiconductor storage device according to claim 12, the method further comprising:
 continuously forming a second insulation layer to cover the plurality of first conductive layers.

14. The method of manufacturing the non-volatile semiconductor storage device according to claim 13, wherein
 after the plurality of first conductive layers are processed in a stepwise manner in relation to each other and before the first through hole is formed, the second insulation layer is continuously formed to cover the plurality of first conductive layers, and
 the first through hole is formed to penetrate the plurality of first conductive layers and the second insulation layer.

15. The method of manufacturing the non-volatile semiconductor storage device according to claim 13, wherein
 after the first through hole is formed and the plurality of first conductive layers are processed in a stepwise manner in relation to each other, and before the first insulation layer is formed in the first through hole, the second insulation layer is continuously formed to cover the plurality of first conductive layers.

16. The method of manufacturing the non-volatile semiconductor storage device according to claim 13, wherein
 after the first insulation layer is formed in the first through hole and the plurality of first conductive layers are processed in a stepwise manner in relation to each other, the second insulation layer is continuously formed to cover the plurality of first conductive layers.

17. The method of manufacturing the non-volatile semiconductor storage device according to claim 12, wherein
 a resist is formed on an upper layer of the plurality of first conductive layers, the resist is repeatedly slimed down and the first conductive layers are repeatedly etched using the resist as a mask to process the first conductive layers in a stepwise manner in relation to each other.

18. The method of manufacturing the non-volatile semiconductor storage device according to claim 13, wherein
 the second insulation layer is composed of silicon nitride.

19. The method of manufacturing the non-volatile semiconductor storage device according to claim 12, wherein
 the first insulation layer is composed of material with a higher etching rate than silicon oxide.

20. The method of manufacturing the non-volatile semiconductor storage device according to claim 12, the method further comprising:

forming a third conductive layer extending in parallel to the substrate before forming the plurality of first conductive layers, wherein the plurality of first conductive layers are formed on an upper layer of the third conductive layer, and the second conductive layers are formed in contact with the top surface of the third conductive layer.

* * * * *